(12) United States Patent
Lee

(10) Patent No.: US 12,322,610 B2
(45) Date of Patent: Jun. 3, 2025

(54) PROCESSING LIQUID SUPPLY APPARATUS AND METHOD OF REMOVING SOLIDS FROM PROCESSING LIQUID SUPPLY APPARATUS

(71) Applicant: SEMES CO., LTD., Cheonan-si (KR)

(72) Inventor: Mu Hyeon Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 406 days.

(21) Appl. No.: 17/569,463

(22) Filed: Jan. 5, 2022

(65) Prior Publication Data

US 2022/0216072 A1    Jul. 7, 2022

(30) Foreign Application Priority Data

Jan. 7, 2021   (KR) .................. 10-2021-0001834

(51) Int. Cl.
 *B08B 9/027* (2006.01)
 *H01L 21/311* (2006.01)
 *H01L 21/67* (2006.01)

(52) U.S. Cl.
 CPC .......... *H01L 21/6708* (2013.01); *B08B 9/027* (2013.01); *H01L 21/31111* (2013.01); *H01L 21/67017* (2013.01); *H01L 21/6704* (2013.01); *H01L 21/67051* (2013.01); *H01L 21/67075* (2013.01); *H01L 21/67253* (2013.01)

(58) Field of Classification Search
 None
 See application file for complete search history.

(56) References Cited

U.S. PATENT DOCUMENTS

| | | |
|---|---|---|
| 10,037,901 B2 | 7/2018 | Koyama et al. |
| 11,430,675 B2 | 8/2022 | Sato et al. |
| 2002/0168879 A1 | 11/2002 | Tanaka |
| 2014/0377463 A1 | 12/2014 | Hachiya et al. |
| 2019/0088510 A1 | 3/2019 | Ishibashi |
| 2020/0312682 A1 | 10/2020 | Yoshida |

FOREIGN PATENT DOCUMENTS

| | | |
|---|---|---|
| CN | 1310291 | 4/2007 |
| JP | 2005-117014 | 4/2005 |
| JP | 4692997 | 3/2006 |
| KR | 1020190099814 | 8/2019 |
| KR | 1020200115316 | 10/2020 |
| TW | 201341070 | 10/2013 |

(Continued)

OTHER PUBLICATIONS

Office Action from the Japan Patent Office dated Jan. 17, 2023.

(Continued)

*Primary Examiner* — Levon J Shahinian

(57) ABSTRACT

Proposed herein are a processing liquid supply apparatus and a method of removing solids from the processing liquid supply apparatus. The proposed processing liquid supply apparatus has a flushing function for removing solids such as silica which are precipitated as a result of supplying a processing liquid from the processing liquid supply apparatus to a substrate processing apparatus. The processing liquid supply apparatus supplies the processing liquid to a substrate processing apparatus and then recovers and regenerates the processing liquid. The proposed method provides a method of removing solids such as solid silica from the processing liquid supply apparatus.

10 Claims, 26 Drawing Sheets

(56) References Cited

FOREIGN PATENT DOCUMENTS

| | | |
|---|---|---|
| TW | 201517142 | 5/2015 |
| TW | 201606907 | 2/2016 |
| TW | 201738003 | 11/2017 |
| TW | 202002051 | 1/2020 |
| WO | 2012-043767 | 4/2012 |

OTHER PUBLICATIONS

Office Action from the Korean Intellectual Property Office dated Jan. 25, 2023.
Office Action from the Taiwan Intellectual Property Office dated Mar. 13, 2023.

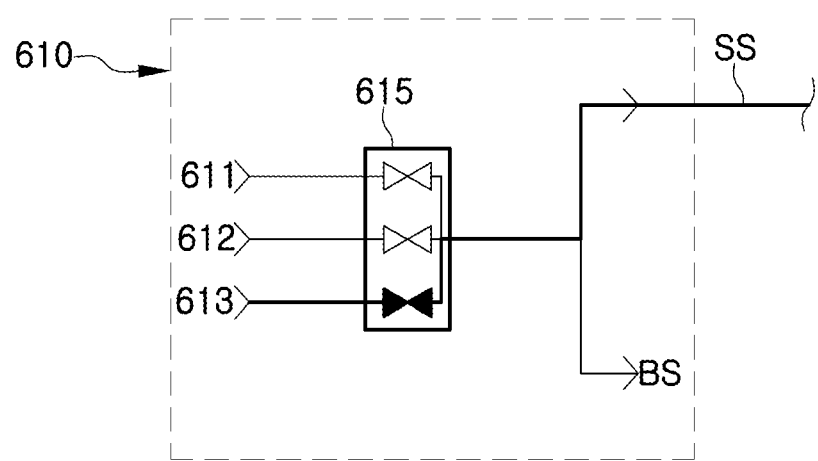

PROCESSING LIQUID SUPPLY APPARATUS AND METHOD OF REMOVING SOLIDS FROM PROCESSING LIQUID SUPPLY APPARATUS

CROSS REFERENCE TO RELATED APPLICATION

The present application claims priority to Korean Patent Application No. 10-2021-0001834, filed Jan. 7, 2021, the entire contents of which is incorporated herein for all purposes by this reference.

BACKGROUND OF THE INVENTION

1. Field of the Invention

The present disclosure relates to a processing liquid supply apparatus and a method of removing solids from the processing liquid supply apparatus. More specifically, the present disclosure relates to a processing liquid supply apparatus which supplies a processing liquid to a substrate processing apparatus and then recovers and regenerates the liquid and which has a flushing function for removing solids such as silica that are precipitated when the processing liquid is supplied. The present disclosure also relates to a method of removing the solids such as solid silica from the processing liquid supply apparatus.

2. Description of the Related Art

Ordinarily, various types of processing liquids are used in manufacturing processes of semiconductor devices, display panels, and the like. Concentration, temperature, flow rate, and the like of these processing liquids are adjusted to be suitable for process conditions through the processing liquid supply apparatus and then supplied to the substrate processing apparatus for processing a substrate. At this time, the processing liquid supply apparatus supplies a single processing liquid or a mixture of various processing liquids to the substrate processing apparatus.

For example, in a cleaning or etching process, a processing liquid such as an aqueous phosphoric acid solution is supplied, as an etching solution, to a surface of a substrate on which a silicon nitride film and a silicon oxide film are formed to selectively remove the silicon nitride film.

When the aqueous phosphoric acid solution is used for the selective etching of the silicon nitride film and the silicon oxide film, silica contained in the aqueous phosphoric acid solution is a factor that significantly affects the etching selectivity.

When the aqueous phosphoric acid solution as a processing liquid has an insufficient concentration of silica, the etching rate of the silicon oxide film increases, resulting in a decrease in the etching selectivity for the silicon nitride film. Conversely, when the silica concentration is excessively high, various problems occur such as selective etching not being performed properly or clogging of the filter.

Therefore, when performing the etching process using a processing liquid such as an aqueous phosphoric acid solution, it is important to control the concentration of silica contained in the processing liquid to fall within an appropriate range according to a processing purpose.

In particular, since there recently has been a transition to a new generation of semiconductors, etching equipment is also being switched from batch-type etching equipment to single wafer etching equipment. Batch-type etching equipment has disadvantages such as poor dispersion, issues with flow-related defects, and difficulty of controlling selectivity. Accordingly, single wafer etching equipment is being developed.

Single wafer etching equipment supplies a high-temperature phosphoric acid as a processing liquid to each chamber and has a processing liquid recycling system for recovering and recycling the used processing liquid.

When the temperature of the phosphoric acid as the processing liquid is lowered or the phosphoric acid as the processing liquid does not circulate in an application of such a processing liquid recycling system, liquid silica is precipitated as solid silica to become a particle source or become a cause of pipe clogging and sensing failure.

Accordingly, there are attempts to inhibit precipitation of silica by methods such as supplying a silica precipitation inhibitor, which suppresses silica precipitation. However, such an approach has problems in that it is not easy to control the etching selectivity when the silica precipitation inhibitor is added and solid precipitation of silica cannot be sufficiently inhibited when the processing liquid is exposed to the atmosphere during the process using the processing liquid (hereinafter referred to as "processing liquid process").

Therefore, it is necessary to find a way to more effectively inhibit precipitation of silica or the like and to maintain a stable process yield.

DOCUMENTS OF RELATED ART

Patent Documents (Patent Document 0001) Korean Patent Application Publication No. 10-2020-0115316
(Patent Document 0002) Korean Patent Application Publication No. 10-2019-0099814

SUMMARY OF THE INVENTION

The present disclosure has been made keeping in mind the above problems occurring in the prior art, and an objective of the present disclosure is to solve a problem of an unstable process yield due to solid precipitation of silica or the like.

In particular, the present disclosure proposes a method of removing precipitated solids such as silica by intensively flushing a solid precipitation region of a processing liquid supply apparatus where the silica is easily precipitated.

Furthermore, it is proposed to solve a problem of solids such as solid silica being precipitated and acting as a particle source and also to solve problems of pipe clogging in substrate processing facilities, sensing failure, or the like due to solid precipitations of silica or the like.

Objectives of the present disclosure are not limited to those mentioned above, and other objectives not mentioned will be clearly understood by those skilled in the art from the following description.

According to an embodiment of the present invention, a processing liquid supply apparatus may include: a flushing supply system configured to selectively supply a flushing fluid to a predetermined solid precipitation region of the processing liquid supply apparatus, a flushing control system configured to regulate a flow of the flushing fluid to flush the solid precipitation region, a flushing discharge system configured to discharge the processing liquid or flushing fluid from the solid precipitation region, and a controller configured to control the flushing supply system, the flushing control system, and the flushing discharge system such that the flushing of the solid precipitation region is controlled.

According to an embodiment of the present invention, a method of removing solids from the processing liquid supply apparatus may include: a processing liquid discharging step for discharging processing liquid remaining in a predetermined solid precipitation region of the processing liquid supply apparatus, a flushing step for performing flushing by supplying a flushing fluid to the solid precipitation region, and a flushing fluid discharging step for selectively discharging the used flushing fluid from the solid precipitation region.

According to an embodiment of the present invention, a processing liquid supply apparatus may include: a flushing fluid supply unit which supplies the flushing fluid containing at least one substance selected from the group consisting of HF, DIW, and an inert gas; a flushing fluid supply line for transporting the flushing fluid to a solid precipitation region; a flushing supply system including a flushing fluid supply valve for selectively supplying the flushing fluid from the flushing fluid supply unit to the flushing fluid supply line; a flushing control system including a flushing control valve for controlling a flow of the flushing fluid to the solid precipitation region to flush residual processing liquid with the flushing fluid; a flushing discharge system including a plurality of drain lines for discharging the residual processing liquid or the residual used flushing fluid in each of the solid precipitation regions, one or more manifold boxes which collect the processing liquid or flushing fluid discharged from a plurality of drain lines selected from among the plurality of drain lines and discharge the collected processing liquid or flushing fluid through one discharge line, and a buffer tank configured to receive and store the processing liquid or the flushing fluid from the one or more manifold boxes; and a controller which controls flushing of the solid precipitation region. By selectively controlling opening and closing of the flushing fluid supply line and opening and closing of the drain line, the controller enables flushing of the solid precipitation region with HF, DIW, and an inert gas in order or with DIW and an inert gas in order.

Advantageous Effects

The present disclosure enables effective maintenance of a process yield since the flushing process can be performed in the processing liquid supply apparatus while effectively removing solid precipitates such as silica and be immediately followed by supplying of the processing liquid.

In particular, in the present disclosure, removal of precipitated solids, such as silica, is made possible by intensive flushing of the solid precipitation region of the processing liquid supply apparatus where silica is easily precipitated.

BRIEF DESCRIPTION OF THE DRAWINGS

The above and other objectives, features, and other advantages of the present disclosure will be more clearly understood from the following detailed description taken in conjunction with the accompanying drawings, in which:

FIGS. 9A, 9B, and 10A to 10C show an embodiment in which flushing of a solid precipitation region of an adjusting supply unit of a processing liquid supply apparatus is performed according to the present disclosure;

DESCRIPTION OF THE EMBODIMENTS

Figure 1:
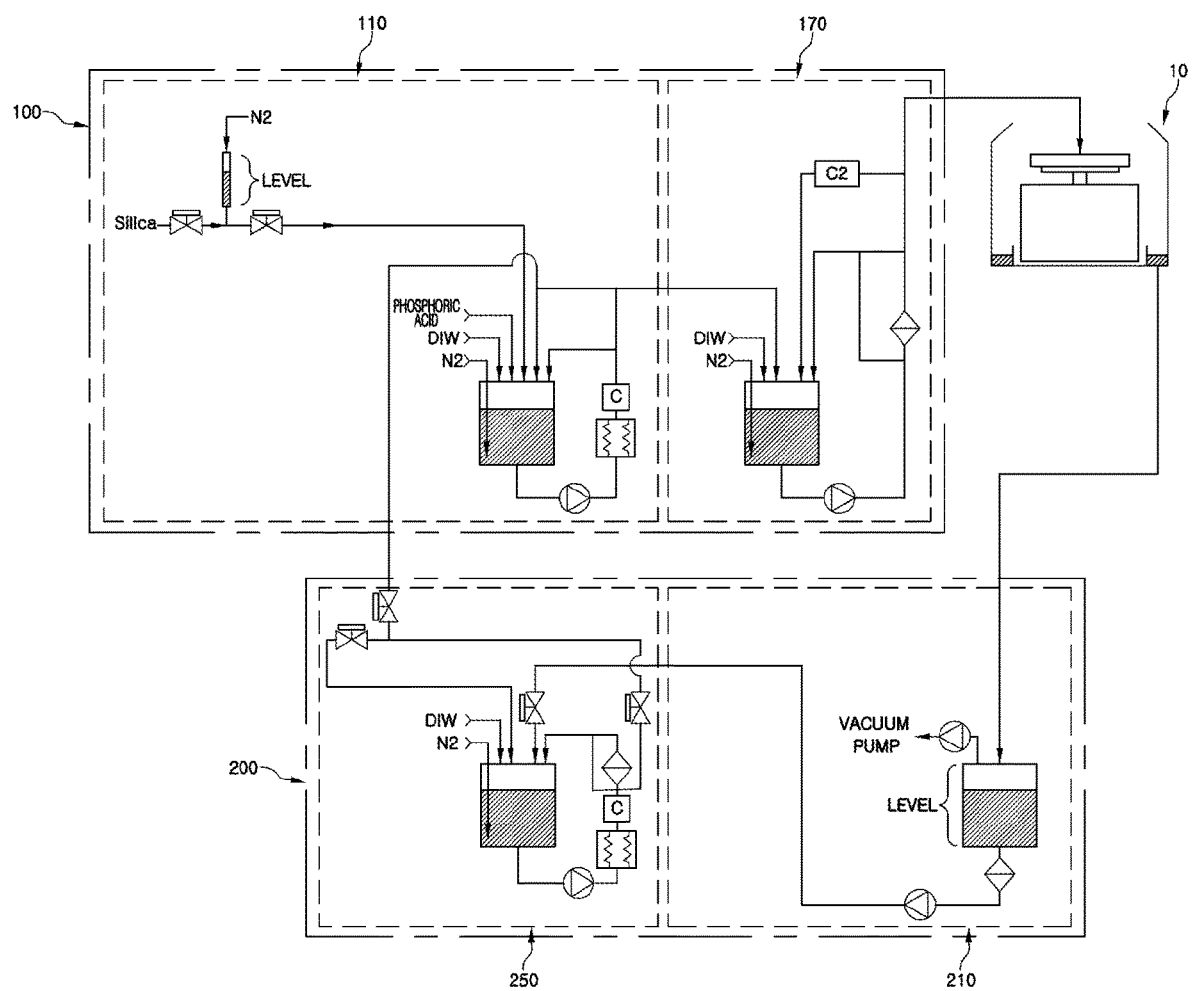
FIG. 1 is a block diagram of an embodiment of a processing liquid supply apparatus to which the present disclosure is applied.

In order to describe the present disclosure, the operational advantages of the present disclosure, and the objectives achieved by the present disclosure, embodiments of the present disclosure are illustrated below, and the present disclosure is described with reference to the embodiments.

First, the terminology used herein is for the purpose of describing particular embodiments only and is not intended to be limiting. As used herein, the singular forms "a", "an", and "the" are intended to include the plural forms as well, unless the context clearly indicates otherwise. The terms "comprise", "include", "have", and the like when used herein should be understood to specify the presence of stated features, numbers, steps, operations, elements, components, or combinations thereof but not to preclude the presence or addition of one or more other features, numbers, steps, operations, elements, components or combinations thereof.

In describing the present disclosure, when it is decided that a detailed description of a known configuration or function related to the disclosure makes the gist of the disclosure unclear, the detailed description is omitted.

The present disclosure discloses a processing liquid supply apparatus which supplies a processing liquid to a substrate processing apparatus and then recovers and regenerates the processing liquid and which has a flushing function of removing solids such as silica that are precipitated when the processing liquid is supplied. The present disclosure also discloses a method of removing the solids such as solid silica from the processing liquid supply apparatus.

First, a schematic configuration of a processing liquid supply apparatus to which the present disclosure is applied will be described through an embodiment, and a particular configuration of the present disclosure for inhibiting solid precipitation of silica and the like in such a processing liquid supply apparatus will be described through the embodiment.

The present disclosure may be applied to a processing liquid supply apparatus which supplies a processing liquid for a wet etching process, which removes a film on a surface of a substrate, or a cleaning process. The processing liquid supply apparatus supplies various processing liquids to a substrate processing apparatus in accordance with substrate processing conditions.

In the following examples, the processing liquid used in the substrate processing process is described as a high-temperature aqueous phosphoric acid solution containing silica, but this is limited for convenience of description. A processing liquid to be used in the processing liquid supply apparatus to which the present disclosure is applied may include at least one substance selected from the group consisting of hydrofluoric acid (HF), sulfuric acid ($H_2SO_4$), hydrogen peroxide ($H_2O_2$), nitric acid ($HNO_3$), phosphoric acid ($H_3PO_4$), ozone water, SC-1 solution (a mixture of ammonium hydroxide ($NH_4OH$), hydrogen peroxide ($H_2O_2$), and water ($H_2O$)), and the like and also may include other various substances that may be used in a substrate processing process.

FIG. 1 is a block diagram of an embodiment of a processing liquid supply apparatus to which the present disclosure is applied.

The processing liquid supply apparatus to which the present disclosure is applied may include a processing liquid supply unit 100, a processing liquid recycling unit 200, a controller (not shown), and the like.

The processing liquid supply unit 100 may include an adjusting supply unit 110 which adjusts and supplies a processing liquid in accordance with substrate processing conditions and a main supply unit 170 that supplies the processing liquid to a substrate processing apparatus 10.

The processing liquid recycling unit 200 may include a recovery unit 210 that recovers the processing liquid from the substrate processing apparatus 10 and a processing liquid regeneration unit 250 which receives the recovered processing liquid from the recovery unit 210, regenerates the processing liquid, and provides the regenerated processing liquid to the adjusting supply unit 110 of the processing liquid supply unit 100.

In addition, the controller (not shown) may control supply, adjustment, recovery, regeneration, or disposal of the processing liquid of the processing liquid supply unit 100 and the processing liquid recycling unit 200.

The present disclosure provides a flushing function for removing solid precipitates such as silica from a processing liquid supply apparatus such as one shown in FIG. 1. Embodiments of a processing liquid supply apparatus according to the present disclosure in which the flushing function has been added to the processing liquid supply apparatus shown in FIG. 1 are described below with reference to FIGS. 2 and 3.

Figure 2:
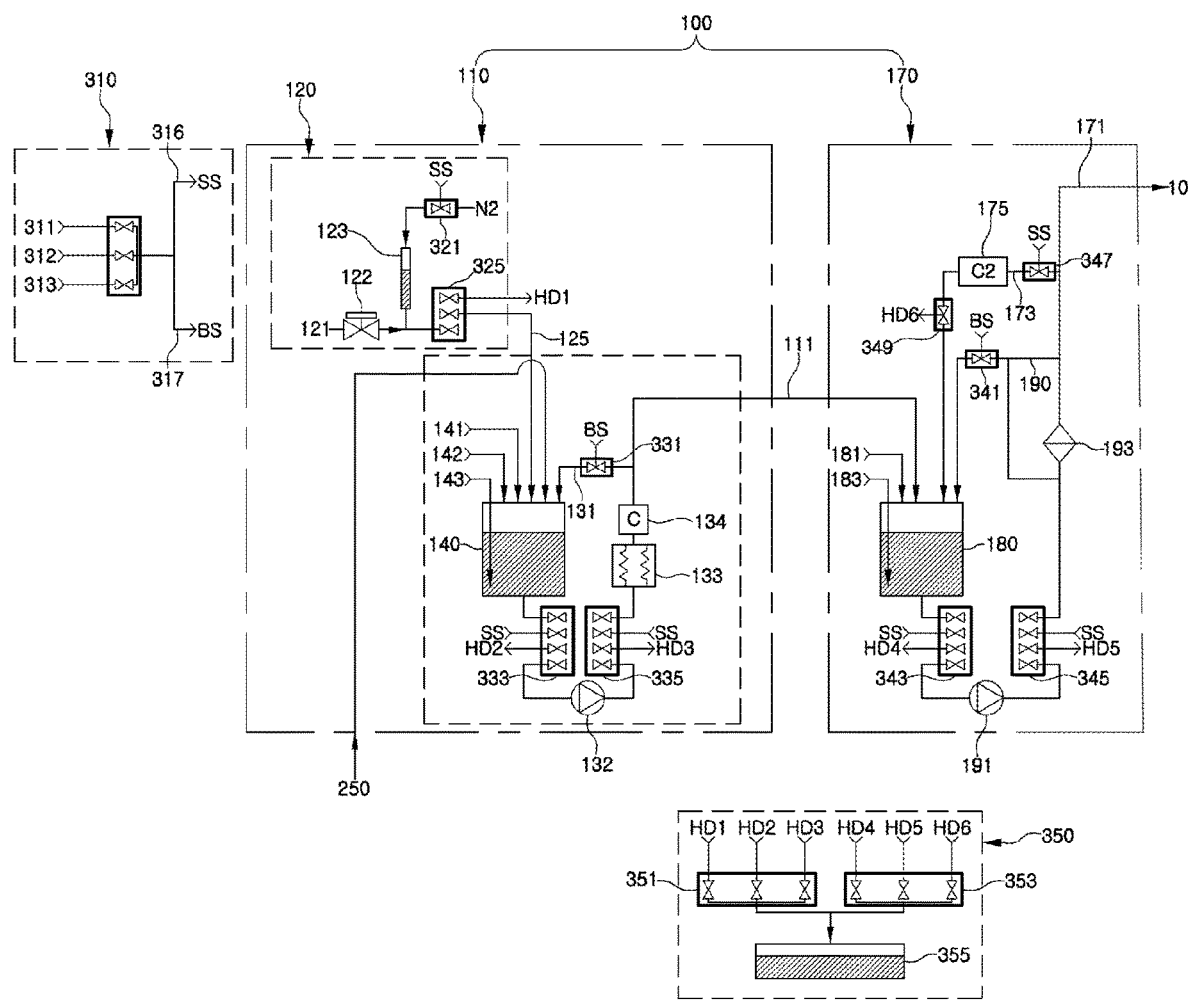
FIG. 2 shows an embodiment of a processing liquid supply unit of the processing liquid supply apparatus according to the present disclosure.
Figure 3:
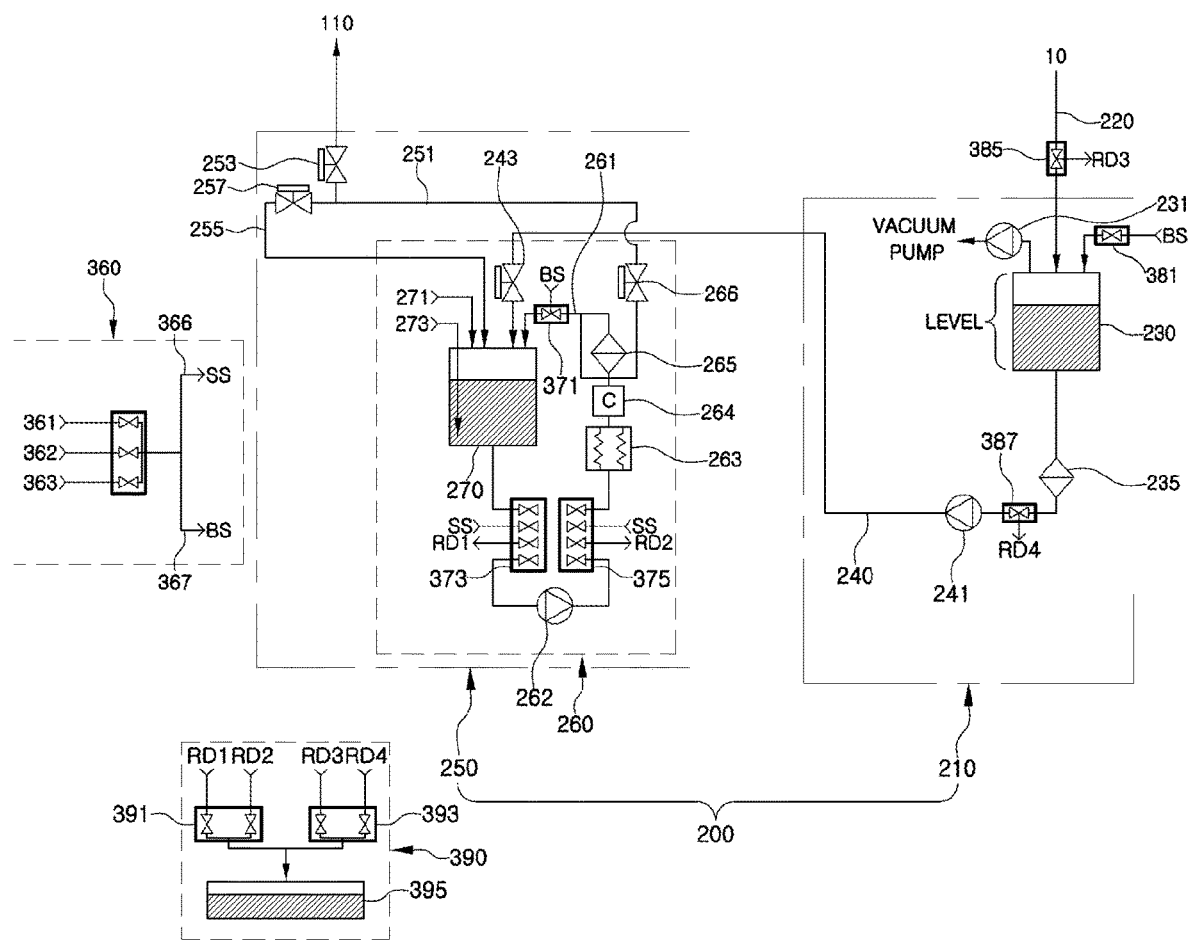
FIG. 3 shows an embodiment of a processing liquid recycling unit according to the present disclosure.

The processing liquid supply unit 100 and the processing liquid recycling unit 200 will be separately examined. FIG. 2 is a case in which a flushing configuration is added to the processing liquid supply unit 100 in the processing liquid supply apparatus. FIG. 3 shows a case in which a flushing configuration is added to the processing liquid recycling unit 200 in the processing liquid supply apparatus.

First, the processing liquid supply unit 100 to which the present invention is applied will be described.

An embodiment of the present invention may include a flushing supply system 310, a flushing control system, a flushing discharge system 350, a controller (not shown), and the like in order to flush the processing liquid supply unit 100.

The flushing supply system 310 may supply a flushing fluid to a part of the processing liquid supply unit 100 set as a solid precipitation region. As the flushing fluid, hydrogen fluoride (HF), deionized water (DIW), an inert gas, or the like may selectively be used alone or in combination.

The flushing supply system 310 may include a flushing fluid supply unit, a flushing fluid supply line, a flushing fluid supply valve, and the like.

The flushing fluid supply unit may be provided with a separate DIW supply unit 311, HF supply unit 312, and inert gas supply unit 313 depending on the flushing fluid used. Through the flushing fluid supply valve 315, HF, DIW, or an inert gas may selectively be supplied to the flushing fluid supply line alone or in combination.

The flushing fluid supply line provides the flushing fluid to the set solid precipitation region in the processing liquid supply unit 100. The supply line may be configured such that an amount of the flushing fluid supplied is adjusted in consideration of the solid precipitation region. For example, when a relatively small amount of flushing fluid supply is required, the flushing fluid may be supplied through a small supply line SS 316, or when a relatively large amount of flushing fluid supply is required, the flushing fluid may be supplied through a large supply line BS 317.

In addition, the flushing control system induces flushing of the corresponding solid precipitation region set in the processing liquid supply unit 100 with the flushing fluid provided from the flushing supply system 310. To this end, the flushing control system may include a flushing control valve disposed in each of the solid precipitation regions. A description of the flushing control system will be provided together with a description of a detailed configuration of the processing liquid supply unit 100.

The flushing discharge system 350 discharges the processing liquid remaining in the set solid precipitation region in the processing liquid supply unit 100 and discharges the flushing fluid used to perform flushing.

The flushing discharge system 350 may include drain lines HD1 to HD6, one or more manifold boxes 351 and 353, a buffer tank 355, and the like.

The drain lines HD1 to HD6 are connected to the solid precipitation region and discharge the processing liquid or the flushing fluid, and for this purpose, may be provided in a number corresponding to the number of solid precipitation regions.

The manifold boxes 351 and 353 may collect processing liquid or flushing fluid discharged from a plurality of drain lines selected from among a plurality of drain lines and discharge the collected processing liquid or flushing fluid through one discharge line.

The buffer tank 355 may receive and store waste liquid from one or more manifold boxes 351 and 353 and discharge the waste liquid to the outside when a predetermined processing of the waste liquid is completed.

In particular, the flushing control system arranged to flush the set solid precipitation region in the processing liquid supply unit 100 of the present disclosure will be described while examining each configuration of the processing liquid supply unit 100.

The processing liquid supply unit 100 includes a main supply unit 170 which supplies the processing liquid to the substrate processing apparatus 10 and an adjusting supply unit 110 which adjusts the processing liquid in accordance with substrate processing conditions and supplies adjusted processing liquid to the main supply unit 170.

The adjusting supply unit 110 may be provided with a silica supply system 120 which supplies silica.

The silica supply system 120 includes a silica supply unit 121 which supplies silica, a silica supply valve 122 for controlling a supply of silica from the silica supply unit 121, and a silica-measuring tube 123 for measuring and supplying a predetermined amount of silica in accordance with the substrate processing conditions.

Since the silica always remains in the silica supply system 120, solid silica may be precipitated due to various conditions such as exposure to air, and the precipitates may cause problems such as blocking of a tube or supplying a solid form of silica.

In particular, since the silica-measuring tube 123 is not a region where silica flows continuously, solid silica may easily be precipitated in the tube. Therefore, in the present disclosure, a region where the silica supply system 120 is disposed may be set as the solid precipitation region, and a flushing configuration may be arranged for the region to support flushing of the region.

The flushing control system disposed in the silica supply system 120 may include a front-end flushing control valve 321 and a rear-end flushing control valve 325.

A flushing fluid supply line SS and a front end of the silica-measuring tube 123 of the silica supply system 120 may be connected to the front-end flushing control valve 321. A multi-directional valve such as a three-way valve may be used as the front-end flushing control valve 321 to selectively supply the flushing fluid and the like.

In addition, a rear end of the silica-measuring tube 123, a silica supply line 125, and a drain line HD1 may be connected to the rear-end flushing control valve 325. A multi-directional valve such as a three-way valve may be used as the rear-end flushing control valve 325 to selectively perform supplying of silica, discharging of flushing fluid, and the like.

In addition, the controller may control supplying of silica to, discharging of silica from, and flushing of the silica supply system 120 through the flushing control system.

An adjusting supply unit 430 may be provided with an adjusting tank 140 for storing the processing liquid, individual substance supply pipes 141 and 142 for supplying each of the processing liquid substances such as phosphoric acid, DIW, or the like to the adjusting tank 140, and an inert gas supply system 143 for providing a pressure to discharge the processing liquid stored in the adjusting tank 140. As the inert gas, nitrogen gas ($N_2$) or the like may be used.

In addition, the adjusting supply unit 110 may be provided with an adjusting circulation line 131 for adjusting the processing liquid in accordance with the substrate processing conditions while self-circulating the processing liquid in the adjusting tank 140. In the adjusting circulation line 131, an adjusting line pump 132 for circulating the processing liquid in the adjusting tank 140, an adjusting line heater 133 for heating the circulating processing liquid, and a measurement system for measuring a concentration or temperature of the processing liquid may be arranged. The measurement system may include a phosphoric acid concentration meter 134 for measuring a concentration of an aqueous phosphoric acid solution, a thermometer (not shown) for measuring a temperature of the aqueous phosphoric acid solution, and the like. The adjusting line pump 132 is a pump with strong chemical resistance. For example, a diaphragm pump may be used to transfer a small amount of processing liquid, and a bellows pump or a magnetic pump may be used to transfer a large amount of processing liquid. Alternatively, a metering pump may be used for precisely circulation of a predetermined amount of a mixed solution.

In addition, although not shown in FIG. 2, a control valve may be provided to perform self-circulation of the processing liquid through the adjusting circulation line 131 or discharge the adjusted processing liquid to the adjusted processing liquid supply pipe 111. The control valve may be a three-way valve, a four-way valve, or the like. For example, when self-circulating the processing liquid, the control valve is closed to circulate the processing liquid through the adjusting circulation line 131. When supplying the adjusted processing liquid, the control valve may be opened to discharge the adjusted processing liquid to the adjusted processing liquid supply pipe 111.

A flow meter (not shown) may be provided in the adjusted processing liquid supply pipe 111 to measure an amount and flow rate of the adjusted processing liquid supplied.

The processing liquid adjusted in the adjusting supply unit 110 may be discharged through the adjusted processing liquid supply pipe 111 and provided to the main supply unit 170.

The operation of the adjusting supply unit 110 may be controlled through a controller. The controller controls the silica supply system 120 to measure and selectively supply a predetermined amount of silica in accordance with the substrate processing conditions. In addition, the controller controls the individual substance supply pipes 141 and 142 to selectively supply the corresponding substance. The controller also controls adjustment of a phosphoric acid concentration and temperature of the processing liquid while selectively performing self-circulation of the processing liquid through the adjusting circulation line 131.

Since the processing liquid does not continuously flow in the adjusting tank 140, adjusting circulation line 131, and the like in the adjusting supply unit 110, the temperature of the processing liquid may decrease accordingly and solids of various processing liquids such as silica may be precipitated.

Therefore, in the present disclosure, the adjusting tank 140 and a selected section of the adjusting circulation line 131 may be set as solid precipitation regions, and a flushing configuration may be arranged for the regions to support flushing of the regions.

For this purpose, flushing control valves of the flushing control system may be disposed on a selected section of the adjusting circulation line 131 and at the input and output ends of the adjusting tank 140. These flushing control valves may be controlled to operate organically with each other.

For example, a flushing control valve 331 may be disposed at the input end of the adjusting tank 140 of the adjusting circulation line 131, and each flushing control valve 333 and 335 may be disposed at the front end and rear end of the adjusting line pump 132 of the adjusting circulation line 131 so that flushing of the adjusting tank 140 and the selected section of the adjusting circulation line 131 may be performed by an organic operation of these flushing control valves.

The flushing control valve 331 disposed at the input end of the adjusting circulation line 131 may be connected to a flushing fluid supply line BS, the input end of the adjusting tank 140, the adjusting circulation line 131, and the like. In addition, a discharge end of the adjusting tank 140, an input end of the adjusting line pump 132, a drain line HD2, a flushing fluid supply line SS, and the like may be connected to the flushing control valve 333 disposed at the front end of the adjusting line pump 132. To the flushing control valve 335 disposed at the rear end of the adjusting line pump 132, an input end of the adjusting circulation line 131, an output end of the adjusting line pump 132, a drain line HD3, a flushing fluid supply line SS, and the like may be connected.

Each of the flushing control valves may be a multi-directional valve according to the required input and output. For example, multi-directional valves such as a four-way valve may be used as the flushing control valves 333 and 335 disposed at the front and rear ends of the adjusting line pump 132 so that the supply and discharge of the processing liquid and the supply and discharge of the flushing fluid may be selectively performed.

In addition, the controller may control supplying of the processing liquid to, discharging of the processing liquid from, and flushing of the selected section of the adjusting circulation line 131 and the adjusting tank 140 through the flushing control system.

Next, a main supply unit 170 will be described. The main supply unit 170 may be provided with a main supply tank 180 for storing the adjusted processing liquid, a substance supply system 181 for supplying a processing liquid substance such as DIW or the like to the main supply tank 180, and an inert gas supply system 183 for providing pressure to discharge the processing liquid stored in the main supply tank 180.

In addition, the main supply unit 170 may be provided with a processing liquid supply pipe 171 which supplies the adjusted processing liquid from the main supply tank 180 to the substrate processing apparatus 10 and a processing liquid supply pipe pump 191 for supplying the processing liquid from the main supply tank 180 to the processing liquid supply pipe 171. A processing liquid supply pipe filter 193 for final filtering of the processing liquid supplied to the substrate processing apparatus 10 may be provided in the processing liquid supply pipe 171.

In addition, a flow meter (not shown) may be provided in the processing liquid supply pipe 171 to measure a supply amount and flow rate of the processing liquid supplied to the substrate processing apparatus 10.

In addition, the main supply unit 170 may include a sampling line 173 for sampling the processing liquid supplied from the main supply tank 180 and a measurement system for measuring the processing liquid of the sampling line 173. The measurement system may include a silica densitometer 175 for measuring a concentration of silica contained in the processing liquid.

In addition, a supplied processing liquid recovery line 190 for recovering a processing liquid not properly adjusted according to the measurement result of the sampled processing liquid may be provided.

The supplied processing liquid recovery line 190 may be connected to the main supply tank 180 to recover the processing liquid thereto based on the measured silica concentration. When necessary, a drain valve may be disposed on the supplied processing liquid recovery line 190 to dispose of processing liquid having a concentration exceeding a predetermined silica concentration by discharging the processing liquid to the outside.

The operation of the main supply unit 170 may be controlled through a controller. The controller controls a supply of the processing liquid from the main supply tank 180 to the substrate processing apparatus 10 through the processing liquid supply pipe 171. The processing liquid supplied through the sampling line 173 may be sampled to check whether the processing liquid has been properly adjusted. For example, a silica concentration or temperature of the processing liquid may be measured, and on the basis of the measurement results, supply of silica to the adjusting supply unit 110 or a heating temperature may be controlled. In addition, when the sampled processing liquid does not meet a predetermined range of substrate processing conditions, the controller may recover the processing liquid supplied to the substrate processing apparatus 10 through the supplied processing liquid recovery line 190 or dispose of the processing liquid by draining the processing liquid to the outside.

Since the main supply unit 170 as described above intermittently supplies the processing liquid to the substrate processing apparatus 10, the temperature of the processing liquid may decrease and solids of various processing liquids such as silica may be precipitated.

Therefore, in the present disclosure, the main supply tank of the main supply unit 170, a selected section of the processing liquid supply pipe 171, and a selected section of the sampling line 173 were set as solid precipitation regions, and a flushing configuration may be arranged for the region to support flushing of the regions.

For this purpose, flushing control valves of the flushing control system may be disposed on a selected section of the processing liquid supply pipe 171 and at the input and output ends of the main supply tank 180. These flushing control valves may be controlled to operate organically with each other. In addition, a flushing control valve of the flushing control system may be disposed on the selected section of the sampling line 173 to perform flushing.

For example, a flushing control valve 341 may be disposed at the input end of the main supply tank 180 of the processing liquid recovery line 190, and each flushing control valve 343 and 345 may be disposed at the front and rear ends of the processing liquid supply pipe pump 191 of the processing liquid supply pipe 171 so that flushing of the main supply tank 180 and the selected section of the processing liquid supply pipe 171 may be performed by an organic operation of these flushing control valves.

The flushing control valve 341 disposed at the input end of the main supply tank 180 may be connected to a flushing fluid supply line BS, the input end of the main supply tank 180, the processing liquid recovery line 190, and the like. In addition, a discharge end of the processing liquid supply pipe pump 191, an input end of the processing liquid supply pipe pump 191, a drain line HD4, a flushing fluid supply line SS, and the like may be connected to the flushing control valve 343 disposed at the front end of the processing liquid supply pipe pump 191. To the flushing control valve 345 disposed at the rear end of the processing liquid supply pipe pump 191, the processing liquid supply pipe 171, an output end of the processing liquid supply pipe pump 191, a drain line HD5, a flushing fluid supply line SS, and the like may be connected.

Each of the flushing control valves may be a multi-directional valve according to the required input and output. For example, multi-directional valves such as a four-way valve may be used as the flushing control valves 343 and 345 disposed at the front and rear ends of the processing liquid supply pipe pump 191 so that the supply and discharge of the processing liquid and the supply and discharge of the flushing fluid may be selectively performed.

In addition, the controller may control supplying of the processing liquid to, discharging of the processing liquid from, and flushing of the selected section of the processing liquid supply pipe 171 and the main supply tank 180 through the flushing control system.

In addition, in the selected section of the sampling line 173, a front-end flushing control valve 347 may be disposed at the front end of the silica densitometer 175 on the sampling line 173 and a rear-end flushing control valve 349 may be disposed at the rear end of the silica densitometer 175 on the sampling line 173 to enable discharging of residual processing liquid in the sampling line 173 and flushing with the flushing fluid.

A flushing fluid supply line SS may be connected to the front-end flushing control valve 347 disposed at the front end of the silica densitometer 175, and a drain line HD6 may be connected to the rear-end flushing control valve 349 disposed at the rear end of the silica densitometer 175.

In addition, the controller may control supplying of the processing liquid to, discharging of the processing liquid from, and flushing of the selected section of the sampling line 173 through the flushing control system.

Next, the processing liquid recycling unit 200 to which the present disclosure is applied will be described.

An embodiment of the present disclosure may include a flushing supply system 360, a flushing control system, a flushing discharge system 390, a controller (not shown), and the like in order to flush the processing liquid recycling unit 200.

Since the flushing supply system 360 and the flushing discharge system 390 are similar to the description provided with reference to FIG. 2 above, a description thereof will be omitted.

The flushing control system induces flushing of a corresponding solid precipitation region set in the processing liquid recycling unit 200 with the flushing fluid provided from the flushing supply system 360. To this end, the flushing control system may include a flushing control valve disposed in each of the solid precipitation regions. A description of the flushing control system will be provided together with a description of a detailed configuration of the processing liquid recycling unit 200.

The processing liquid recycling unit 200 may be spatially separated from the processing liquid supply unit 100 described above and disposed as different equipment. That is, in order to solve spatial limitations of a substrate processing facility, the processing liquid recycling unit 200 may be configured as an independent device separate from the processing liquid supply unit 100 and be disposed in a different place from the processing liquid supply unit 100.

As described above, since the processing liquid supply unit 100 and the processing liquid recycling unit 200 may be spatially separated and disposed as different equipment, a configuration for flushing each unit may also be configured individually.

The processing liquid recycling unit 200 may include a recovery unit 210 which recovers used waste processing liquid from the substrate processing apparatus 10 and a processing liquid regeneration unit 250 which regenerates the recovered waste processing liquid recovered by the recovery unit 210 and supplies the regenerated processing liquid to the adjusting supply unit 110 of the processing liquid supply unit 100.

The recovery unit 210 may include a waste processing liquid supply pipe 220 through which the waste processing liquid is supplied from the substrate processing apparatus 10 and a recovery tank 230 which is connected to the waste processing liquid supply pipe 220 and which temporarily stores the waste processing liquid.

In addition, the recovery unit 210 may be provided with a recovered processing liquid supply pipe 240 for supplying the waste processing liquid stored in the recovery tank 230 to the processing liquid regeneration unit 250 and a recovery pipe pump 241 for discharging the waste processing liquid stored in the recovery tank 230 to the recovered processing liquid supply pipe 240.

In addition, the recovery unit 210 may be provided with a main filter 235 for filtering foreign substances when supplying the waste processing liquid to the processing liquid regeneration unit 250 through the recovered processing liquid supply pipe 240.

The operation of the recovery unit 210 may be controlled by a controller. The controller may temporarily store the waste processing liquid in the recovery tank 230 of the recovery unit 210 and supply the waste processing liquid in the recovery tank 230 to the processing liquid regeneration unit 250 or dispose of the processing liquid by draining the processing liquid to the outside.

The recovery unit 210 recovers the used processing liquid from the substrate processing apparatus 10 and temporarily stores the liquid. The used processing liquid contains large amounts of various foreign substances, and solids of various processing liquids such as silica may be precipitated in the recovery unit 210 due to storage of such used processing liquid.

Therefore, in the present disclosure, a selected section such as the recovery tank 230 of the recovery unit 210 may be set as a solid precipitation region, and a flushing configuration may be arranged for the region to support flushing of the region.

For this purpose, flushing control valves of the flushing control system may be disposed at the front and rear ends of the recovery tank 230. These flushing control valves may operate organically with each other to flush a selected section of the recovery unit 210.

For example, a flushing control valve 385 for discharging the waste processing liquid to a drain line RD3 may be provided on the waste processing liquid supply pipe 220 that receives the waste processing liquid from the substrate processing apparatus 10 and supplies the waste processing liquid to the recovery tank 230. In addition, a flushing control valve 281 connected to a flushing fluid supply line BS to supply the flushing fluid to the recovery tank 230 may be disposed at the front end of the recovery tank 230, and a flushing control valve 287 connected to an output end of the recovery tank 230, the recovered processing liquid supply pipe 240, a drain line RD4, and the like may be disposed.

In addition, the controller may control supplying of the processing liquid to, discharging of the processing liquid from, and flushing of the selected section of the recovery unit 210 and the recovery tank 230 through the flushing control system.

The waste processing liquid recovered by the recovery unit 210 may be filtered, supplied to the processing liquid regeneration unit 250, and regenerated by the processing liquid regeneration unit 250 to an appropriate level for use.

The processing liquid regeneration unit 250 may include a regeneration tank 270 for storing the processing liquid supplied from the recovery unit 210, and supplying of the processing liquid from the recovered processing liquid supply pipe 240 to the regeneration tank 270 may be controlled through the processing liquid supply valve 243.

The processing liquid regeneration unit 250 may be provided with a processing liquid substance supply pipe 271 for supplying DIW to the regeneration tank 270 and an inert gas supply system 273 for providing pressure to discharge the processing liquid stored in the regeneration tank 270. As the inert gas, nitrogen gas ($N_2$) or the like may be used.

In addition, the processing liquid regeneration unit 250 may be provided with a regeneration circulation line 261 for regenerating the processing liquid while self-circulating the processing liquid in the regeneration tank 270. In the regeneration circulation line 261, a regeneration line pump 262 for circulating the processing liquid, a regeneration line heater 263 for heating the circulating processing liquid, a measuring system for measuring a concentration or temperature of the processing liquid, and the like may be disposed. The measurement system may include a phosphoric acid concentration meter 264 for measuring a phosphoric acid moisture concentration of the processing liquid, a thermometer (not shown) for measuring a temperature of the processing liquid, and the like.

In addition, a regenerated liquid supply valve 266 for self-circulating the processing liquid through the regeneration circulation line 261 or for discharging the regenerated processing liquid to the regenerated processing liquid supply pipe 251 may be provided. A three-way valve, a four-way valve, or the like may be used as the regenerated liquid supply valve 266 to selectively circulate the processing liquid through the regeneration circulation line 261 or discharge the regenerated processing to the regenerated processing liquid supply pipe 251.

In addition, a sub-filter 265 for filtering the processing liquid during self-circulation may be provided on the regeneration circulation line 261.

Furthermore, a recovery line 255 for recovering the processing liquid supplied from the processing liquid regeneration unit 250 to the adjusting supply unit 110 through the regenerated processing liquid supply pipe 251 may be provided. A regenerated processing liquid supply valve 253 for controlling a supply of the regenerated processing liquid to the adjusting supply unit 110 may be disposed on the regenerated processing liquid supply pipe 251, and a regenerated processing liquid recovery valve 257 for recovering the regenerated processing liquid to the recovery line 255 may also be disposed. The regenerated processing liquid supply valve 253 and the regenerated processing liquid recovery valve 257 may be replaced with one three-way valve.

The operation of the processing liquid regeneration unit 250 may be controlled through a controller. The controller enables regeneration of the processing liquid by controlling selective supplying of the waste processing liquid from the recovery unit 210 to the processing liquid regeneration unit 250, controlling each substance supply pipe 271 to selectively supply a corresponding substance such as DIW and the like, and controlling adjustment of a phosphoric acid moisture concentration and temperature during self-circulation of the processing liquid through the regeneration circulation line 261.

Since the processing liquid often does not continuously flow and instead stays in the regeneration tank 270, regeneration circulation line 261, and the like of the processing liquid regeneration unit 250, the temperature of the processing liquid may decrease accordingly and solids of various processing liquids such as silica may be precipitated.

Therefore, in the present disclosure, the regeneration tank 270 and a selected section of the regeneration circulation line 261 are set as solid precipitation regions, and a flushing configuration may be arranged for the regions to support flushing of the regions.

For this purpose, flushing control valves of the flushing control system may be disposed on a selected section of the regeneration circulation line 261 and at the input and output ends of the regeneration tank 270. These flushing control valves may be controlled to operate organically with each other.

For example, a flushing control valve 371 may be disposed at the input end of the regeneration tank 270 of the regeneration circulation line 261, and each flushing control valve 373 and 375 may be disposed at the front end and rear end of the regeneration line pump 262 of the regeneration circulation line 261 so that flushing of the regeneration tank 270 and the selected section of the regeneration circulation line 261 may be performed by an organic operation of these flushing control valves.

The flushing control valve 371 disposed at the input end of the regeneration tank 270 may be connected to a flushing fluid supply line BS, the input end of the regeneration tank 270, the regeneration circulation line 261, and the like. In addition, a discharge end of the regeneration tank 270, an input end of the regeneration line pump 262, a drain line RD1, a flushing fluid supply line SS, and the like may be connected to the flushing control valve 373 disposed at the front end of the regeneration line pump 262. To the flushing control valve 375 disposed at the rear end of the regeneration line pump 262, an input end of the regeneration circulation line 261, an output end of the regeneration line pump 262, a drain line RD2, a flushing fluid supply line SS, and the like may be connected.

Each of the flushing control valves may be a multi-directional valve according to the required input and output. For example, multi-directional valves such as a four-way valve may be used as the flushing control valves 373 and 375 disposed at the front and rear ends of the regeneration line pump 262 so that the supply and discharge of the processing liquid and the supply and discharge of the flushing fluid may be selectively performed.

In addition, the controller may control supplying of the processing liquid to, discharging of the processing liquid from, and flushing of the selected section of the regeneration circulation line 261 and the regeneration tank 270 through the flushing control system.

As described above, in the present disclosure, regions in which solid precipitates such as silica are generated may be set in each of the processing liquid supply unit 100 and processing liquid recycling unit 200, and the present disclosure proposes a processing liquid supply apparatus to which a flushing function has been added by arranging a configuration for flushing these regions.

The processing liquid supply unit 100 of FIG. 2 and the processing liquid recycling unit 200 of FIG. 3 may be arranged in different spaces, and accordingly, two sets of flushing supply system and flushing discharge system for performing flushing have been described as being arranged in the processing liquid supply unit 100 and the processing liquid recycling unit 200, respectively. However, this depends on an arrangement of the processing liquid supply equipment. When the processing liquid supply unit and the processing liquid recycling unit are arranged to be connected in one space, the configuration for performing flushing may also be arranged therewith.

Furthermore, in the processing liquid supply apparatus described above with reference to FIG. 1, one adjusting supply unit 110 may be disposed in the processing liquid supply unit 100, and one processing liquid regeneration unit 250 may be disposed in the processing liquid recycling unit 200. However, the number of the adjusting supply unit 110 of the processing liquid supply unit 100 and the number of the processing liquid regeneration unit 250 of the processing liquid recycling unit 200 may be changed as necessary.

Figure 4:
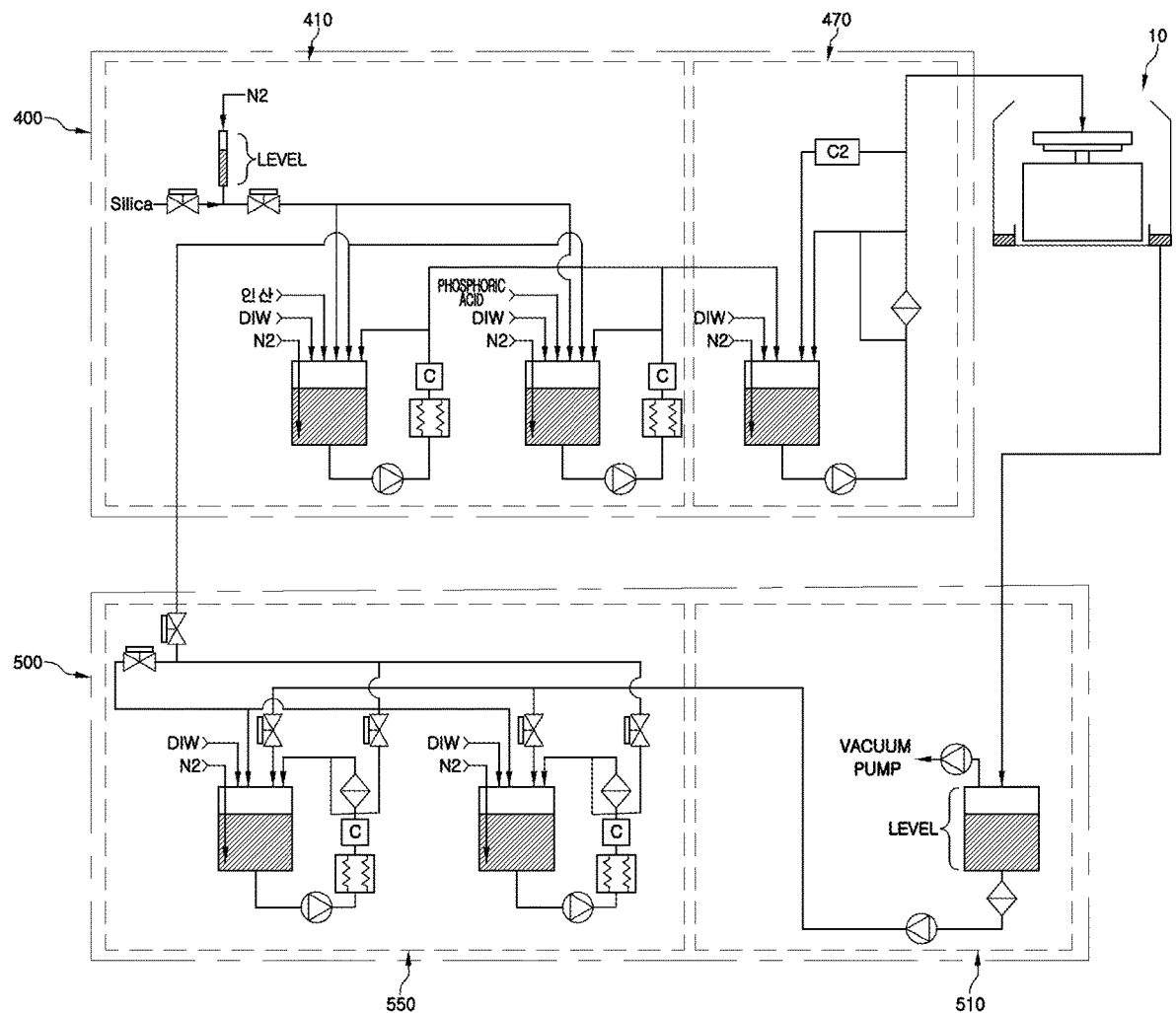
FIG. 4 is a block diagram of another embodiment of a processing liquid supply apparatus to which the present disclosure is applied.

In this regard, FIG. 4 shows a block diagram of another embodiment of a processing liquid supply apparatus to which the present disclosure is applied.

The embodiment shown in FIG. 4 is similar to the embodiment shown in FIG. 1 discussed above in terms of basic configuration. However, the processing liquid supply unit 400 includes two adjusting supply units 410 arranged in parallel, and the processing liquid recycling unit 500 includes two processing liquid regeneration units 550 arranged in parallel.

Through the parallel arrangement of the plurality of adjusting supply units 410, any one adjusting supply unit 410 may supply the main supply unit 470 with a processing liquid whose concentration and temperature are adjusted in accordance with substrate processing conditions while at the same time, the other adjusting supply unit 410 may adjust the concentration and temperature of the processing liquid in accordance with the substrate processing conditions.

In addition, through the parallel arrangement of the plurality of processing liquid regeneration units 550, any one processing liquid regeneration unit 550 may receive used processing liquid from the recovery unit 510 and regenerate the used processing liquid while at the same time, the other processing liquid regeneration unit 550 may supply the regenerated processing liquid to any one of the plurality of adjusting supply units 410.

Through the configuration of the plurality of adjusting supply units 410 and the plurality of processing liquid regeneration units 550, continuous adjustment and regeneration of processing liquid may be performed and at the same time, the adjusted processing liquid may continuously be supplied to the substrate processing apparatus, thereby increasing efficiency of supplying processing liquid.

The present disclosure provides a flushing function for removing solid precipitates such as silica from a processing liquid supply apparatus such as one shown in FIG. 4. Embodiments of a processing liquid supply apparatus according to the present disclosure in which the flushing function has been added to the processing liquid supply apparatus shown in FIG. 4 will be examined separately with reference to two embodiments: the processing liquid supply unit 400 shown in FIG. 5 and the processing liquid recycling unit 500 shown in FIG. 6.

Figure 5:
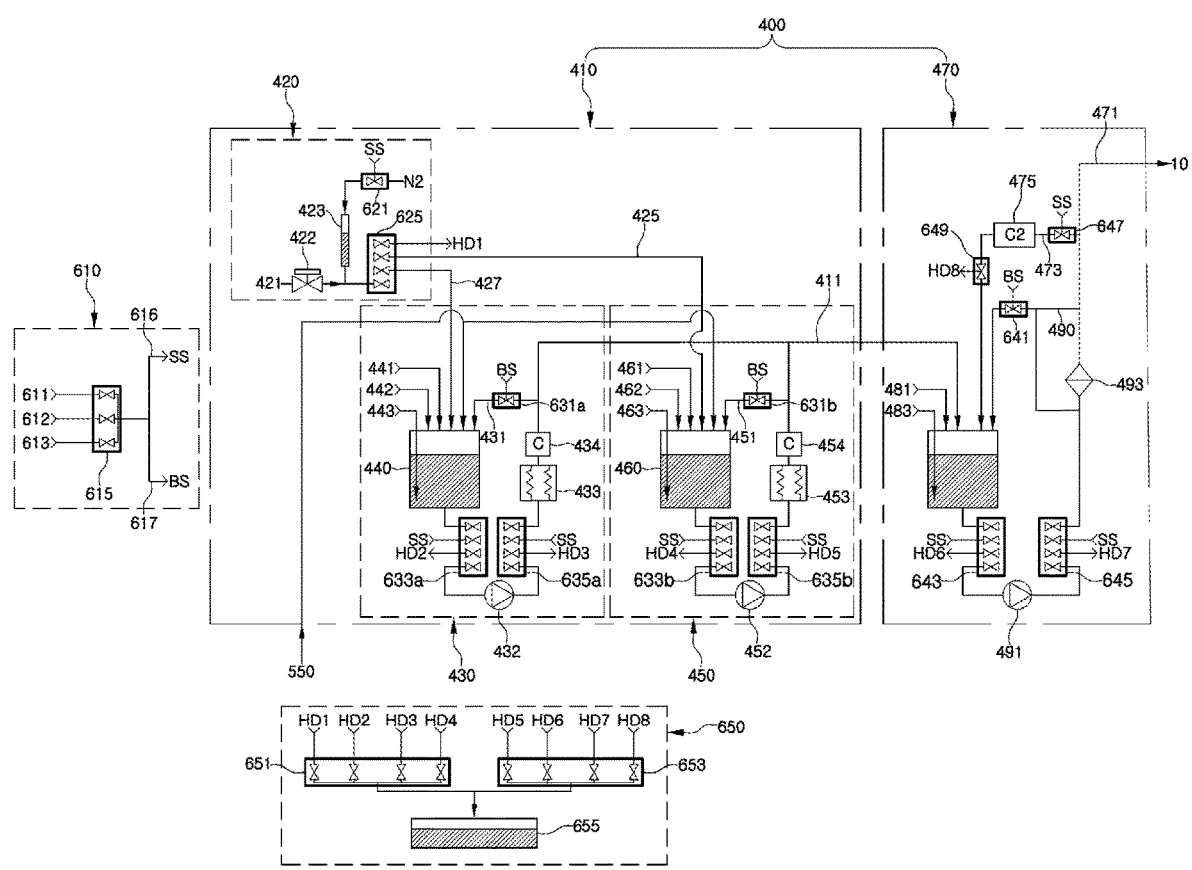
FIG. 5 shows another embodiment of the processing liquid supply unit of the processing liquid supply apparatus according to the present disclosure.

For the embodiment of the processing liquid supply unit 400 of FIG. 5, a description of parts which overlap with the embodiment of the processing liquid supply unit 100 of FIG. 2 described above will be omitted. Similarly, for the embodiment of the processing liquid recycling unit 500 of FIG. 6, a description of parts which overlap with the embodiment of the processing liquid recycling unit 200 of FIG. 3 described above will be omitted.

First, the processing liquid supply unit 400 to which the present disclosure is applied will be described.

A flushing supply system 610, a flushing control system, a flushing discharge system 650, a controller (not shown), and the like may be provided with the processing liquid supply unit 400 of FIG. 5 in order to flush the processing liquid supply unit 400.

The flushing supply system 610 may be provided with a separate DIW supply unit 611, HF supply unit 612, and inert gas supply unit 613 depending on the flushing fluid used. Through a flushing fluid supply valve 615, HF, DIW, or an inert gas may selectively be supplied to the flushing fluid supply line alone or in combination.

The flushing fluid supply line provides flushing fluid to a set solid precipitation region in processing liquid supply unit 400. Depending on a supply amount of flushing fluid required, a small supply line SS 616 or a large supply line BS 617 may be provided.

In addition, the flushing control system induces flushing of the corresponding solid precipitation region set in the processing liquid supply unit 400 with the flushing fluid provided from the flushing supply system 610. To this end, the flushing control system may include a flushing control valve disposed in each of the solid precipitation regions. A description of the flushing control system will be provided together with a description of a detailed configuration of the processing liquid supply unit 400.

The flushing discharge system 650 discharges the processing liquid remaining in the set solid precipitation region in the processing liquid supply unit 400 and discharges the flushing fluid used to perform flushing. The flushing discharge system 350 may include drain lines HD1 to HD8, one or more manifold boxes 651 and 653, a buffer tank 655, and the like.

The drain lines HD1 to HD8 are connected to the solid precipitation region and discharge the processing liquid or the flushing fluid, and the number of drain lines provided may be adjusted according to number of set solid precipitation regions.

The manifold boxes 651 and 653 may collect processing liquid or flushing fluid discharged from a plurality of drain lines selected from among a plurality of drain lines and discharge the collected processing liquid or flushing fluid through one discharge line. The buffer tank 355 may receive and store waste liquid from one or more manifold boxes 651 and 653 and discharge the waste liquid to the outside when a predetermined processing of the waste liquid is completed.

The flushing control system arranged to flush the set solid precipitation region in the processing liquid supply unit 400 of the present disclosure will be described while examining each configuration of the processing liquid supply unit 400.

The processing liquid supply unit 400 includes a main supply unit 470 which supplies the processing liquid to the substrate processing apparatus 10 and an adjusting supply unit 410 which adjusts the processing liquid in accordance with substrate processing conditions and supplies adjusted processing liquid to the main supply unit 470.

The adjusting supply unit 410 may include a first adjusting supply unit 430, a second adjusting supply unit 450, and a silica supply system 420. The silica supply system 420 may selectively supply silica to each of the first adjusting supply unit 430 and the second adjusting supply unit 450.

The silica supply system 420 is similar to that shown in FIG. 2 above, and the area in which the silica supply system 420 is disposed may be set as the solid precipitation region, and a flushing configuration may be arranged for the region to support flushing of the region.

As a configuration for flushing the silica supply system 420, the flushing control system may include a front-end flushing control valve 621 and a rear-end flushing control valve 625.

A silica supply line 425 for supplying silica to the first adjusting supply unit 430 and a silica supply line 427 for supplying silica to the second adjusting supply unit 450 may be connected to the rear-end flushing control valve 625, which may be controlled to selectively supply silica to the first adjusting supply unit 430 and the second adjusting supply unit 450.

The controller may control supplying of silica to, discharging of silica from, and flushing of the silica supply system 420 through the flushing control system.

Each of the first adjusting supply unit 430 and the second adjusting supply unit 450 has a configuration similar to that of the adjusting supply unit 110 of the embodiment shown in FIG. 2.

The processing liquid adjusted by the adjusting supply unit 410 may be selectively discharged from the first adjusting supply unit 430, the second adjusting supply unit 450, or both through the adjusted processing liquid supply pipe 411 and provided to the main supply unit 470.

The operation of the adjusting supply unit 410 may be controlled through the controller. The controller controls the silica supply system 420 to measure a supply amount of silica and selectively supply a predetermined amount of silica to the first adjusting supply unit 430 and the second adjusting supply unit 450 in accordance with the substrate processing conditions. In addition, the controller controls the individual substance supply pipes 441, 442, 461, and 462 to selectively supply the corresponding substance. The controller also controls adjustment of a phosphoric acid concentration and temperature of the processing liquid while selectively performing self-circulation of the processing liquid through a first adjusting circulation line 431 or a second adjusting circulation line 451.

In some embodiments, the controller controls the adjusting supply units such that one of either the first adjusting supply unit 430 or the second adjusting supply unit 450 adjusts the processing liquid and the other supplies the processing liquid to the main supply unit 470 or receives the processing liquid from the processing liquid regeneration unit 550.

In addition, in the embodiment shown in FIG. 5, a solid precipitation region may be set for each of the first adjusting supply unit 430 and the second adjusting supply unit 450, and a flushing configuration may be arranged for each solid precipitation region.

For example, a first adjusting tank 440 and a selected section of the first adjusting circulation line 431 of the first adjusting supply unit 430 may be set as solid precipitation regions, and a flushing configuration may be arranged for the regions. In addition, a second adjusting tank 460 and a selected section of the second adjusting circulation line 451 of the second adjusting supply unit 450 may be set as solid precipitation regions, and a flushing configuration may be arranged for the regions.

For each solid precipitation region set in the first adjusting supply unit 430 and the second adjusting supply unit 450, a flushing control valve of the flushing control system such as the one described above through the embodiment shown in FIG. 2 may be disposed. The controller may control these flushing control valves to operate organically with each other to enable supplying of processing liquid to, discharging of processing liquid from, and flushing of each of the solid precipitation regions.

The main supply unit 470 will be described hereinafter. The main supply unit 470 has a configuration similar to that shown in FIG. 2. The main supply tank 480 of the main supply unit 470, a selected section of a processing liquid supply pipe 471, and a selected section of a sampling line 473 may be set as solid precipitation regions, and a flushing configuration may be arranged for the regions to support flushing of the regions.

Since flushing control valves of the flushing control system disposed in these solid precipitation regions have a configuration similar to those of FIG. 2, a description thereof will be omitted.

In addition, the controller may control supplying of the processing liquid to, discharging of the processing liquid from, and flushing of the selected section of the processing liquid supply pipe 471, the main supply tank 480, and the selected section of the sampling line 472 through the flushing control system.

Next, the processing liquid recycling unit 500 to which the present disclosure is applied will be described.

Figure 6:
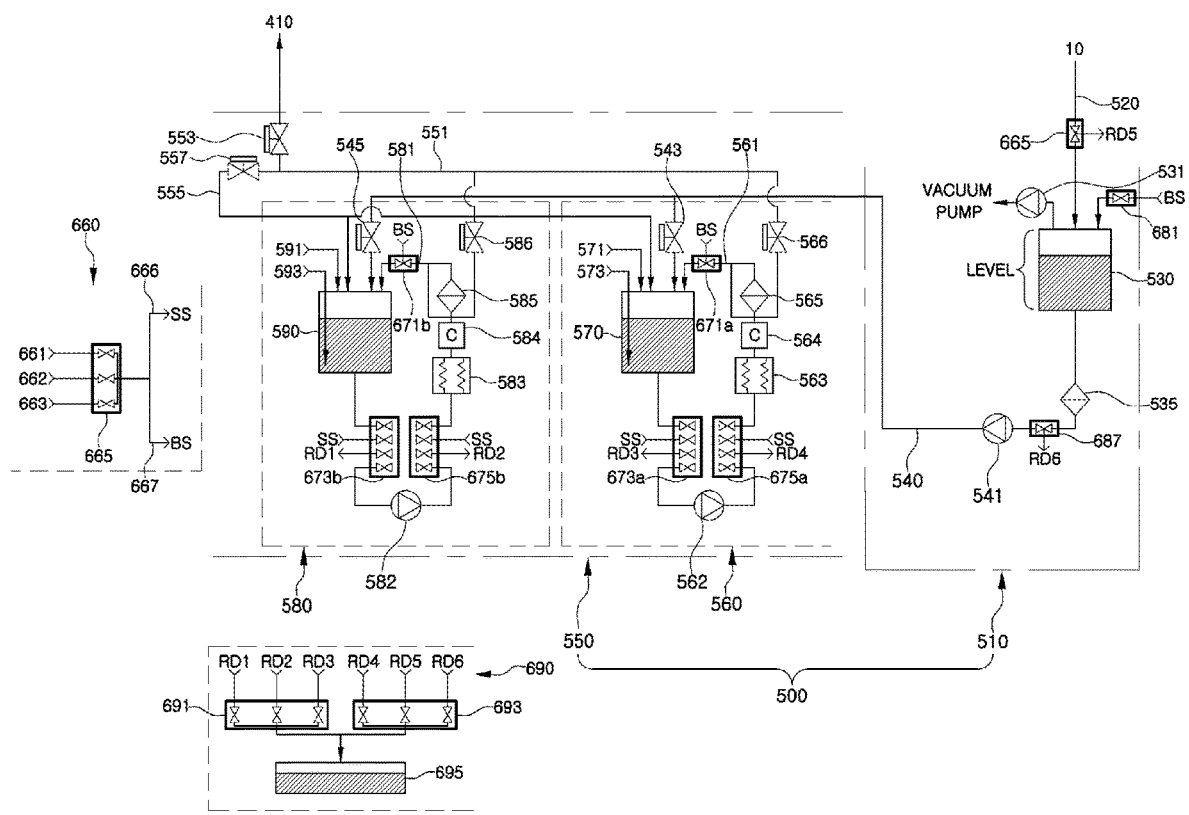
FIG. 6 shows another embodiment of the processing liquid recycling unit according to the present disclosure.

A flushing supply system 660, a flushing control system, a flushing discharge system 690, a controller (not shown), and the like may be provided with the processing liquid recycling unit 500 of FIG. 6 in order to flush the processing liquid recycling unit 500.

Since the flushing supply system 660 and the flushing discharge system 690 are similar to those of the other embodiments described above, a description thereof will be omitted.

The flushing control system induces flushing of a corresponding solid precipitation region set in the processing liquid recycling unit 500 with the flushing fluid provided from the flushing supply system 660. To this end, the flushing control system may include a flushing control valve disposed in each of the solid precipitation regions. A description of the flushing control system will be provided together with a description of a detailed configuration of the processing liquid recycling unit 500.

The processing liquid recycling unit 500 may include a recovery unit 510 which recovers used waste processing liquid from the substrate processing apparatus 10 and a processing liquid regeneration unit 550 which regenerates the recovered waste processing liquid recovered by the recovery unit 510 and supplies the regenerated processing liquid to the adjusting supply unit 410 of the processing liquid supply unit 400.

The recovery unit 510 is similar to the recovery unit 210 of FIG. 3 discussed above. The controller may control to temporarily store the waste processing liquid in the recovery tank 530 of the recovery unit 510 and supply the waste processing liquid of the recovery tank 530 to either a first processing liquid regeneration unit 560 or a second processing liquid regeneration unit 580 of the processing liquid regeneration unit 550 according to operating conditions of the regeneration units.

In the present disclosure, a selected section such as the recovery tank 530 of the recovery unit 510 may be set as a solid precipitation region, and a flushing configuration may be arranged for the region to support flushing of the region.

Since flushing control valves of the flushing control system disposed in these solid precipitation regions have a configuration similar to those of FIG. 3, a description thereof will be omitted.

The waste processing liquid recovered by the recovery unit 510 may be filtered, supplied to the processing liquid regeneration unit 550, and regenerated by the processing liquid regeneration unit 550 to an appropriate level for use.

The processing liquid regeneration unit 500 may include the first processing liquid regeneration unit 560 and the second processing liquid regeneration unit 580. The first processing liquid regeneration unit 560 and the second processing liquid regeneration unit 580 may be arranged in parallel and may be individually operated at the same time or at different times.

The first processing liquid regeneration unit 560 and the second processing liquid regeneration unit 580 may regenerate the processing liquid according to regeneration conditions and then selectively provide the regenerated processing liquid to the adjusting supply unit 410 through the regenerated processing liquid supply pipe 551. Each of the first processing liquid regeneration unit 560 and the second processing liquid regeneration unit 580 has a configuration similar to that of the processing liquid regeneration unit 250 of FIG. 3 described above.

Furthermore, when the adjusting supply unit 410 includes the first adjusting supply unit and the second adjusting supply unit, the processing liquid regeneration unit 550 may provide the regenerated processing liquid to any one of the first adjusting supply unit and the second adjusting supply unit according to the operating conditions of the adjusting supply units. Alternatively, the processing liquid regeneration unit 550 may supply the regenerated processing liquid only to the first adjusting supply unit.

The operation of the processing liquid regeneration unit 550 may be controlled through a controller. The controller enables regeneration of the processing liquid by controlling selective supplying of the waste processing liquid from the recovery unit 510 to the first processing liquid regeneration unit 560, the second processing liquid regeneration unit 580, or both, controlling each substance supply pipe 571 and 591 to selectively supply a corresponding substance such as DIW and the like, and controlling adjustment of a phosphoric acid moisture concentration and temperature during self-circulation of the processing liquid through a first regeneration circulation line 561 and a second regeneration circulation line 581.

In some embodiments, the controller controls the processing liquid regeneration units such that one of either the first processing liquid regeneration unit 560 or the second processing liquid regeneration unit 580 regenerates the processing liquid and the other supplies the regenerated processing liquid to the adjusting supply unit 410 or receives the waste processing liquid from the recovery unit 510.

In addition, in the embodiment shown in FIG. 6, a selected area on the first processing liquid regeneration unit 560 and the second processing liquid regeneration unit 580 may be set as solid precipitation regions, and a flushing configuration may be arranged for the regions.

For example, a first regeneration tank 570 and a selected section of the first regeneration circulation line 561 of the first processing liquid regeneration unit 560 may be set as solid precipitation regions, and a flushing configuration may be arranged for the regions. In addition, a second regeneration tank 590 and a selected section of the second regeneration circulation line 581 of the second processing liquid regeneration unit 580 may be set as solid precipitation regions, and a flushing configuration may be arranged for the regions.

In addition, the controller may control supplying of the processing liquid, discharging of the processing liquid, and flushing through the flushing control system disposed in the first processing liquid regeneration unit 560 and the second processing liquid regeneration unit 580.

In the present disclosure, solid precipitates such as silica may be effectively removed by arranging the flushing configuration in the processing liquid supply apparatus as described above.

Furthermore, the present disclosure proposes a method of removing solids from the processing liquid supply apparatus through the processing liquid supply apparatus having a flushing function as described above. The method will be described hereinafter.

The method of removing solids from the processing liquid supply apparatus according to the present disclosure roughly includes: a processing liquid discharging step for discharging processing liquid remaining in a predetermined solid precipitation region of the processing liquid supply apparatus, a flushing step for performing flushing by supplying a flushing fluid to the solid precipitation region, and a flushing fluid discharging step for selectively discharging the flushing fluid that was used to perform flushing from the solid precipitation region.

Figure 7:
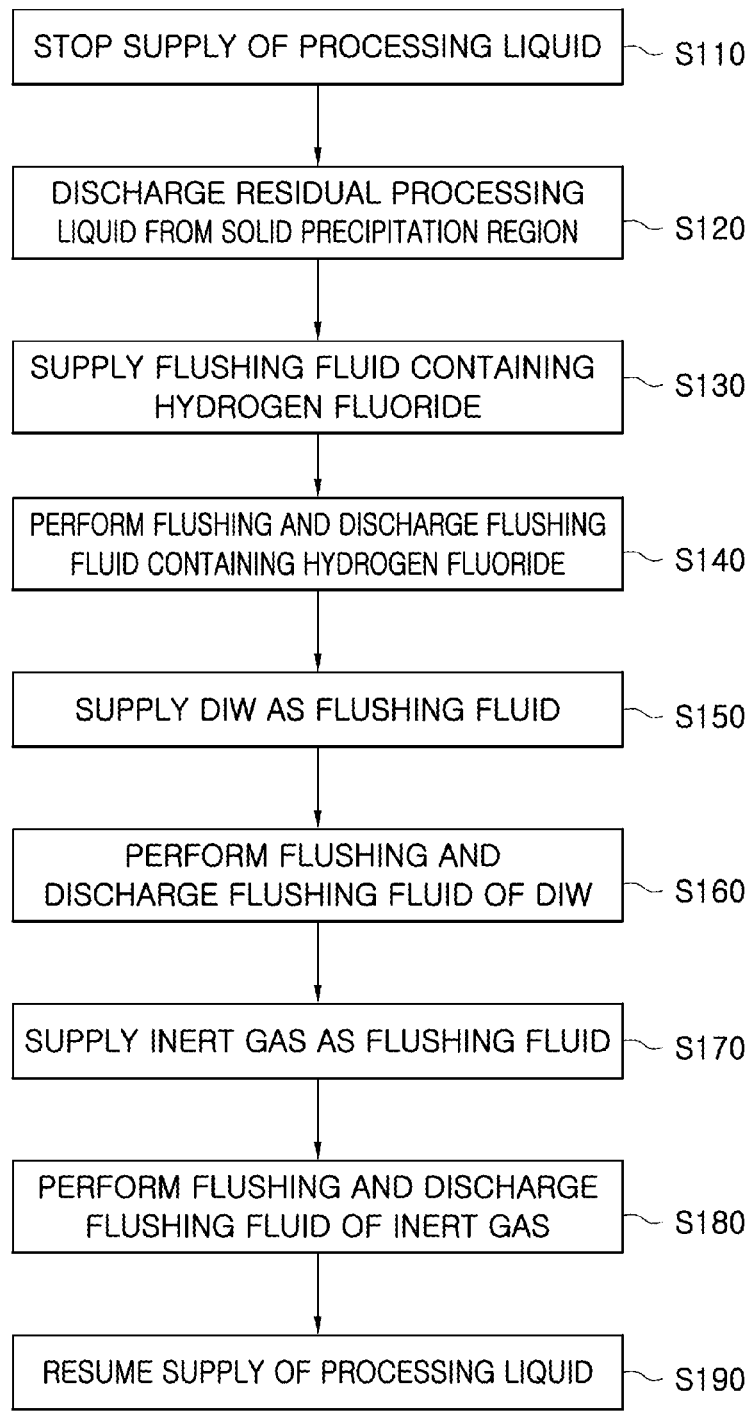
FIG. 7 is a flowchart illustrating an embodiment of a method of removing solids from a processing liquid supply apparatus according to the present disclosure.

FIG. 7 is a flowchart illustrating an embodiment of a method of removing solids from a processing liquid supply apparatus according to the present disclosure.

First, in order to perform flushing, a supply of the processing liquid to the processing liquid supply apparatus may be stopped (S110), and the processing liquid remaining in the processing liquid supply apparatus may be discharged (S120).

After discharging the residual processing liquid, flushing may be performed by supplying a flushing fluid to the solid precipitation region. The flushing may be performed by supplying various flushing fluids in a sequential order.

First, a flushing fluid containing HF may be supplied to the corresponding solid precipitation region (S130) to perform flushing through which solid precipitates adhered to pipes and the like are removed. Then, the flushing fluid may be discharged through a drain line (S140).

The flushing fluid containing HF may be an aqueous solution of HF whose concentration is adjusted considering a type of precipitate to be removed, characteristics of the solid precipitation region to be flushed, and the like. In addition, when flushing with HF is not appropriate due to the material characteristics of the solid precipitation region of the processing liquid supply apparatus to be flushed, the process of performing flushing with the flushing fluid containing HF may be removed.

Next, flushing may be performed by supplying DIW as a flushing fluid to the corresponding solid precipitation region (S150), and the flushing fluid may be discharged through a drain line (S160).

The DIW as the flushing fluid can remove precipitates remaining on the pipes and the like. At the same time, since HF may remain in the pipes and the like due to the previously performed flushing with HF, flushing with DIW can dilute and remove the HF.

Finally, flushing may be performed by supplying an inert gas as a flushing fluid to the corresponding solid precipitation region (S170), and impurities may be discharged through a drain line along with the inert gas (S180).

Since flushing of the solid precipitation region was performed with various flushing fluids, DIW and the like may remain in the pipes in addition to any floating particles that did not get discharged. Supplying the inert gas as the flushing fluid at a certain level of pressure can remove the DIW, floating particles, and the like. In particular, the residual DIW and the like may affect a concentration of processing liquids supplied thereafter. By evaporating or discharging any residual flushing fluids such as the DIW, the solid precipitation region where the flushing was performed may be made into a completely empty space.

Furthermore, depending on circumstances, a cycle of flushing with the flushing fluid containing hydrogen fluoride and flushing with DIW as the flushing fluid may be repeated, and flushing with an inert gas as the flushing fluid may be performed at the end.

When the flushing of the corresponding solid precipitation region is completed, supplying of the processing liquid through the processing liquid supply apparatus may be resumed (S190) to supply the processing liquid to the substrate processing apparatus.

The present disclosure enables effective removal of solid precipitates such as silica from the processing liquid supply apparatus through such a flushing process.

Hereinafter, a process of performing flushing according to the present disclosure for each part set as a solid precipitation region on the processing liquid supply device will be described.

Figure 8A:
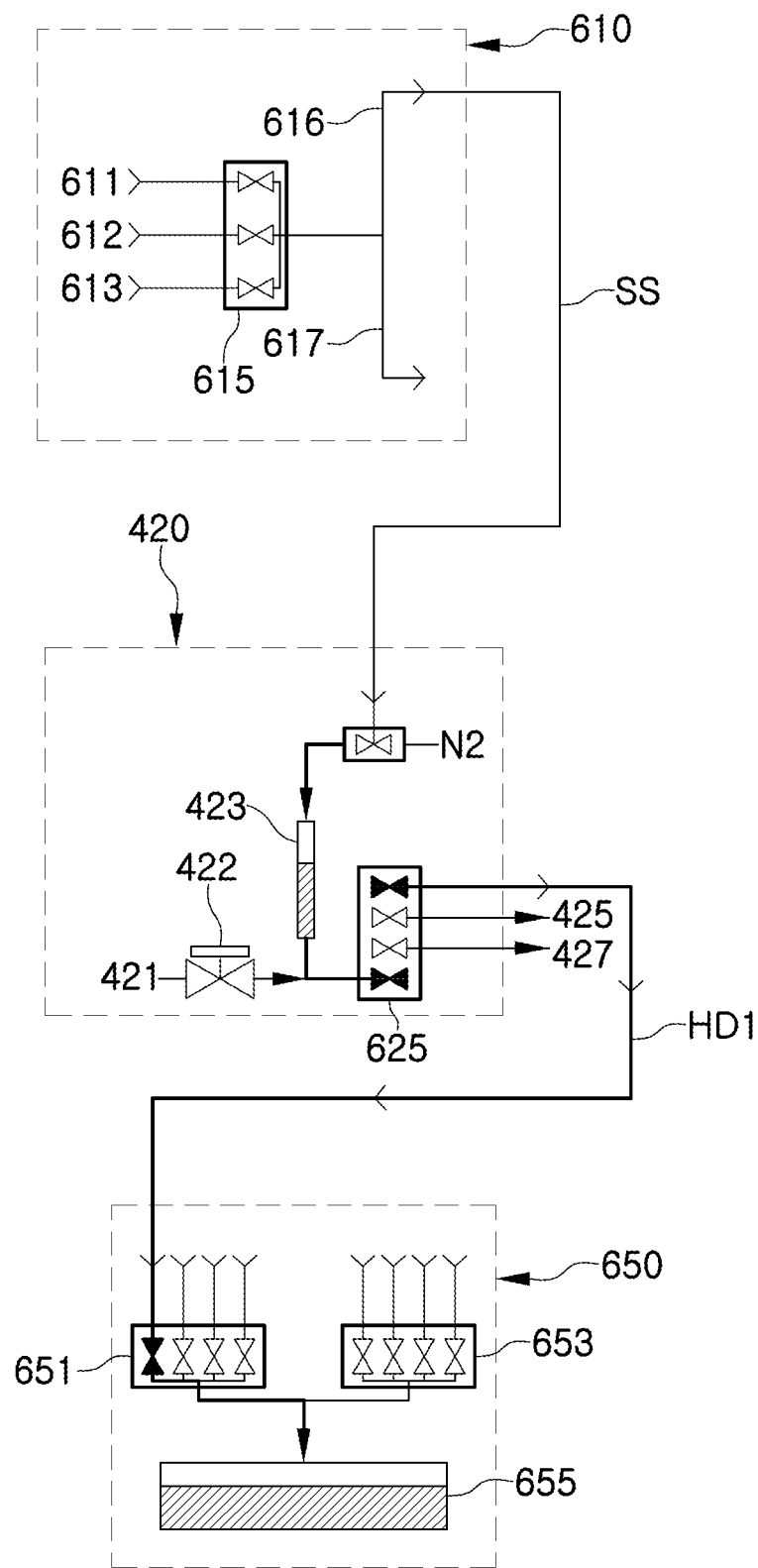
FIGS. 8A to 8C show an embodiment in which flushing of a solid precipitation region of a silica supply system of a processing liquid supply apparatus is performed according to the present disclosure.
Figure 8B:
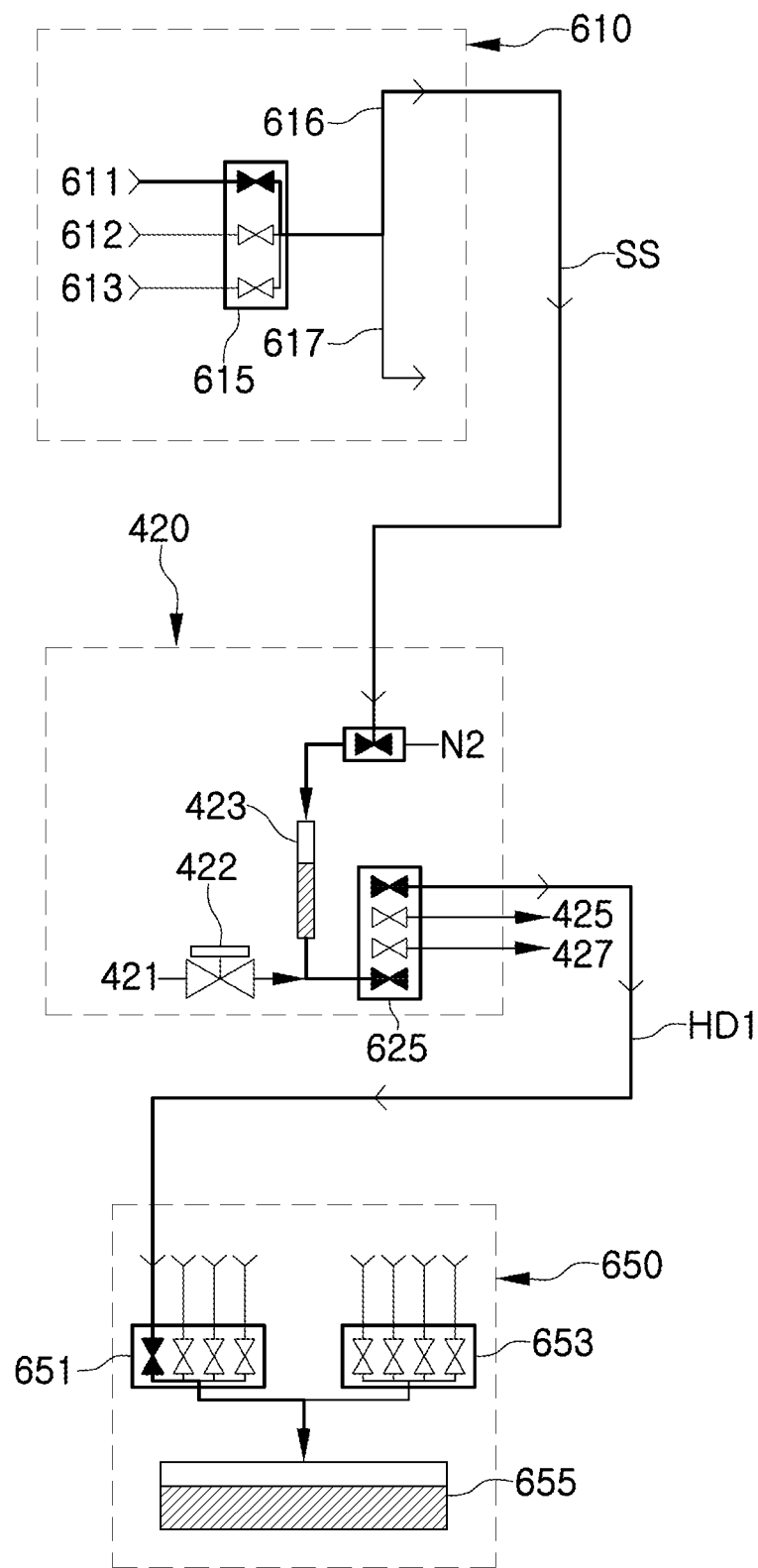
Figure 8C:
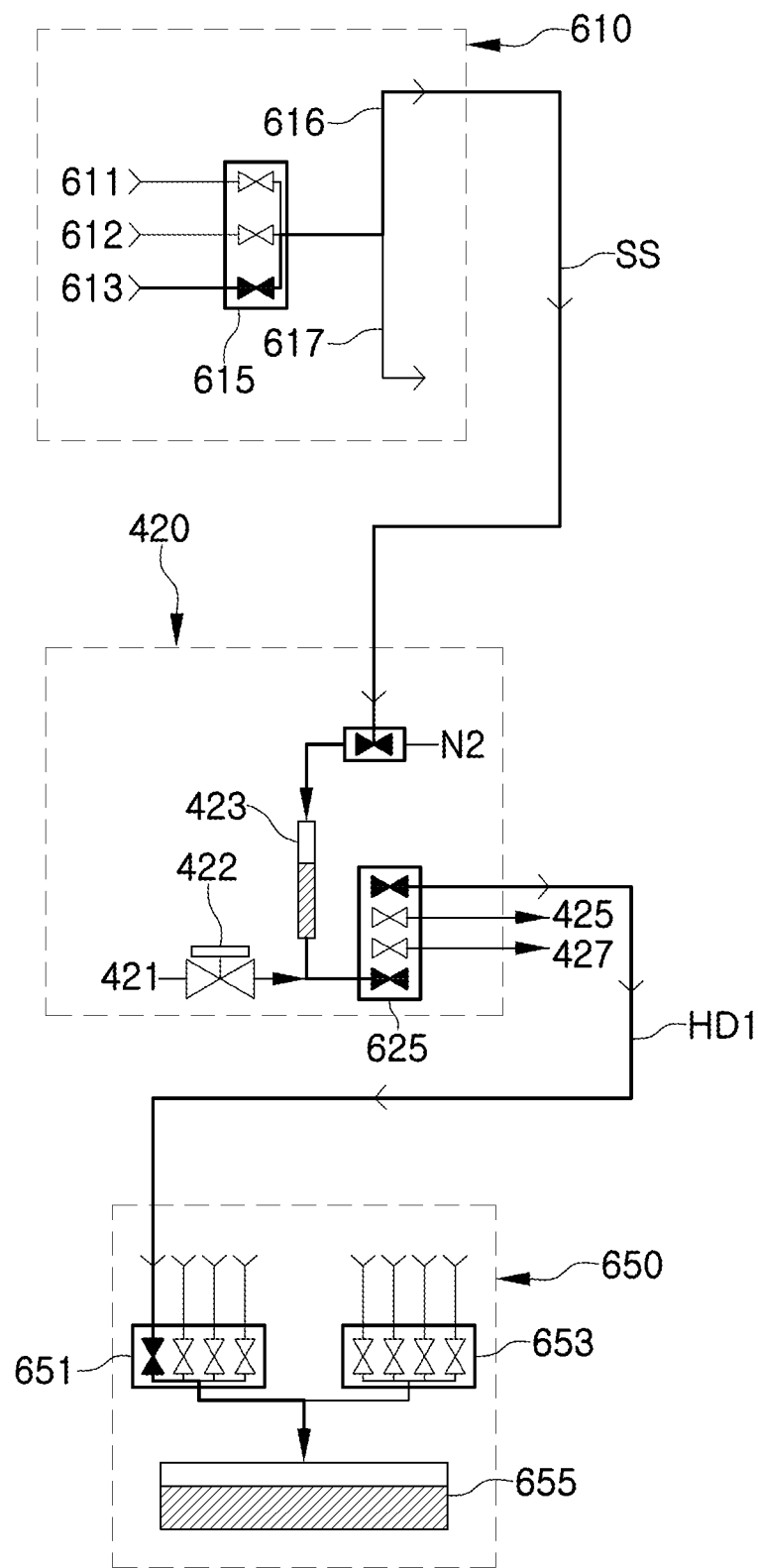

FIGS. 8A to 8C show an embodiment in which flushing is performed according to the present disclosure on a region where a silica supply system for supplying silica to a processing liquid supply apparatus is disposed.

The silica supply system 420 of FIGS. 8A to 8C is the silica supply system 420 disposed in the processing liquid supply unit 400 of FIG. 5. A selected predetermined section including a silica-measuring tube 423 may be set as a solid precipitation region, and flushing may be performed on the region.

The controller stops the supply of silica from the silica supply system 420 and discharges the silica remaining in the solid precipitation region including the silica-measuring tube 423 through the drain line HD1 as shown in FIG. 8A. At this time, a multi-directional valve may be used as the flushing control valve 625 of the flushing control system to selectively stop the supply of silica to the adjusting supply unit of the silica supply system 420 while opening the drain line HD1 to discharge the residual silica.

The drain line HD1 may be combined with several other drain lines through the manifold box 651 of the flushing discharge system 650. The residual silica discharged through the drain line HD1 may be stored in the buffer tank 655, subjected to predetermined processing, and discharged to the outside.

When the silica remaining in the solid precipitation region including the silica-measuring tube 423 gets discharged, as shown in FIG. 8B, the controller may control the flushing fluid supply valve 615 to supply DIW from the DIW supply unit 611 of the flushing supply system 610 to the solid precipitation region including the silica-measuring tube 423. The DIW may be controlled to be supplied through the flushing supply line SS 616 because the DIW does not need to be supplied in a large amount.

When the DIW is supplied to the solid precipitation region including the silica-measuring tube 423 as the flushing fluid, solid precipitates such as silica remaining in the solid precipitation region including the silica-measuring tube 423 may be removed due to the flow and pressure of the flushing fluid.

The controller controls the flushing control valve 625 to discharge the DIW used as the flushing fluid, which contains impurities such as solids as a result of flushing, through the drain line HD1.

Depending on circumstances, the controller may first perform flushing with a flushing fluid containing HF prior to performing flushing using the DIW as the flushing fluid.

When flushing using a flushing fluid such as DIW is completed, as shown in FIG. 8C, the controller may control the flushing fluid supply valve 615 to supply an inert gas as the flushing fluid from the inert gas supply unit 613 to the solid precipitation region including the silica-measuring tube 423 and to open the drain line HD1 for discharging.

Impurities, DIW, and the like remaining in the solid precipitation region including the silica-measuring tube 423 may be discharged through the drain line HD1 by the pressure of the inert gas supplied.

These flushing fluids and impurities may be stored in the buffer tank 655 of the flushing discharge system 650 when discharged through the drain line HD1 and may be discharged to the outside after being subjected to a predetermined processing process.

Through such a flushing process, solid precipitates, impurities, or the like may be removed from the solid precipitation region including the silica-measuring tube 423. In addition, the flushing fluids may also be completely removed using the inert gas, thereby enabling supplying of a high-quality processing solution immediately after flushing.

FIGS. 9 and 10 show an embodiment in which flushing of a solid precipitation region of an adjusting supply unit of a processing liquid supply apparatus is performed according to the present disclosure.

The adjusting supply unit 430 shown in FIGS. 9 and 10 is the first adjusting supply unit 430 disposed in the processing liquid supply unit 400 of FIG. 5. The first adjusting tank 440 and the selected section of the first adjusting circulation line 431 may be set as solid precipitation regions, and flushing may be performed on the regions.

Figure 9A:
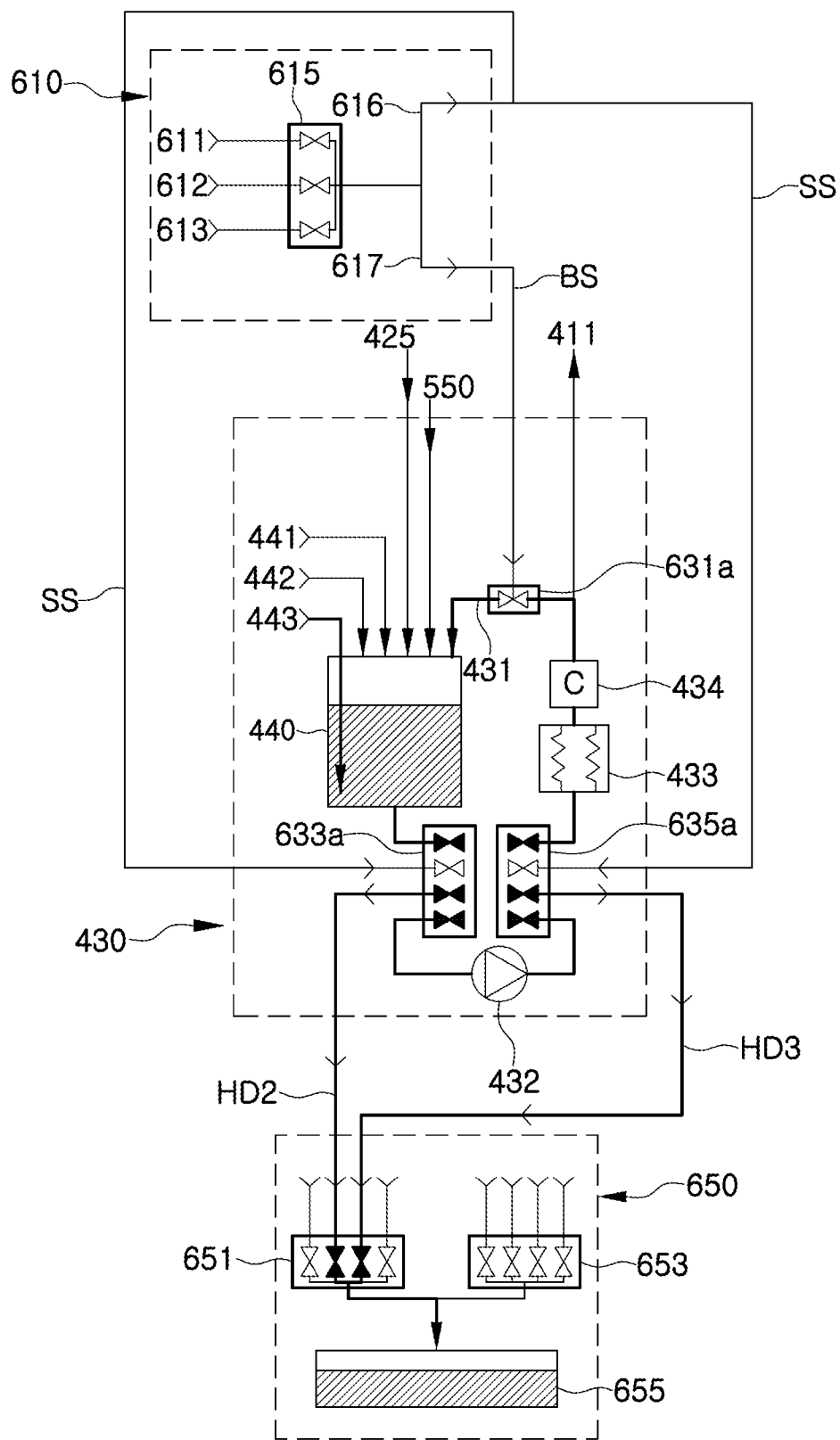

The controller stops the supply of processing liquid from the first adjusting supply unit 430 and discharges the processing liquid remaining in the first adjusting tank 440 and the first adjusting circulation line 431 through the drain lines HD2 and HD3 as shown in FIG. 9A. At this time, a four-way valve may be used as the flushing control valves 633a and 635a of the flushing control system so that the valves may be controlled to circulate the processing liquid of the first adjusting tank 440 and the first adjusting circulation line 431 and discharge the processing liquid through the drain lines HD2 and The drain lines HD2 and HD3 may be combined through the manifold box 651 of the flushing discharge system 650. The discharged processing liquid may be stored in the buffer tank 655, subjected to predetermined processing, and discharged to the outside.

Figure 9B:
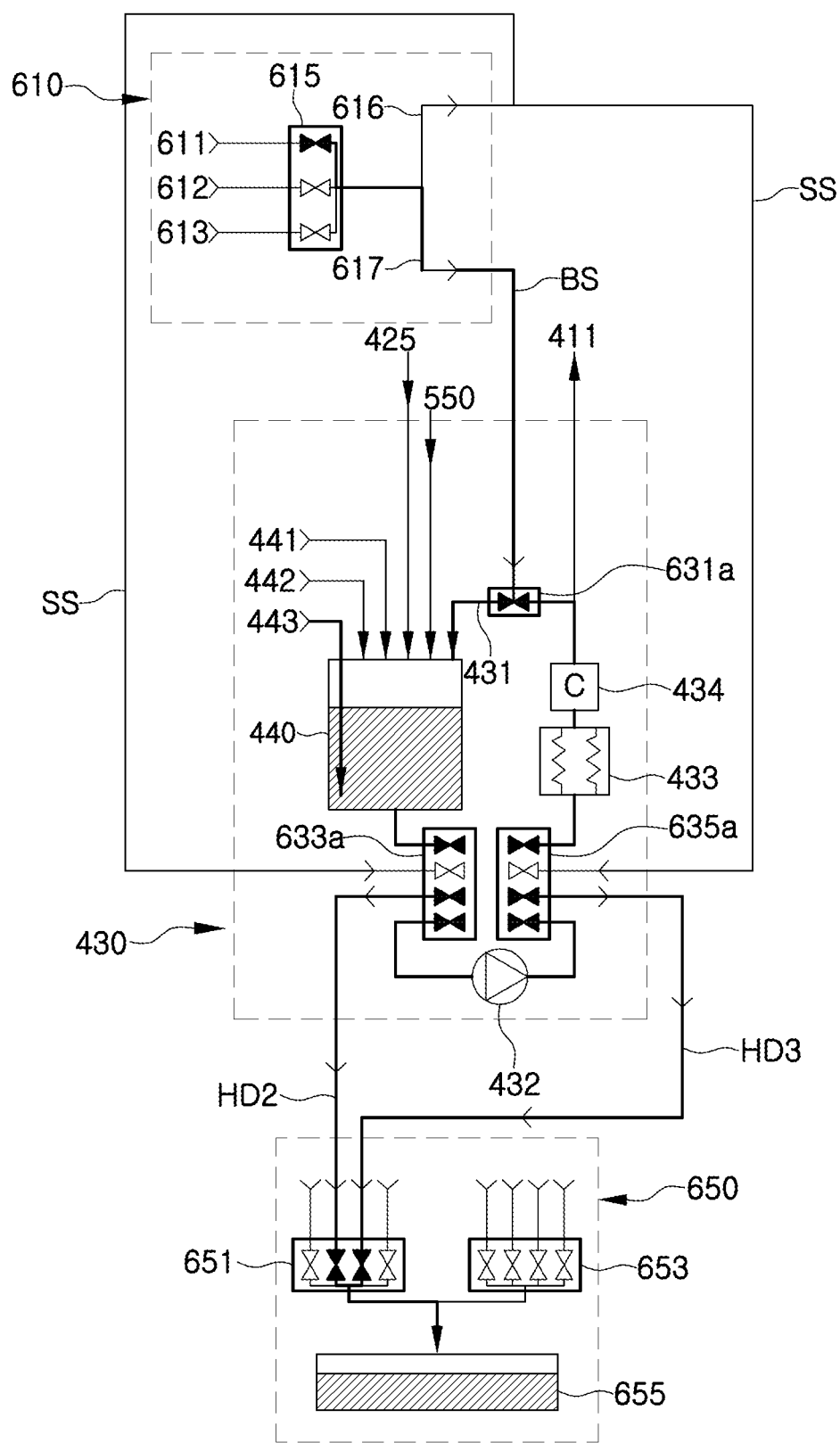

When the processing liquid remaining in the solid precipitation regions of the first adjusting supply unit 430 gets discharged, as shown in FIG. 9B, the controller may control the flushing control valve 331 disposed at the input end of the first adjusting tank 440 of the first adjusting circulation line 431 to supply the DIW as the flushing fluid to the solid precipitation regions of the first adjusting supply unit 430. At this time, since a large amount of DIW needs to be supplied to the first adjusting tank 440 of the first adjusting supply unit 430 and the like, the DIW may be supplied through the flushing fluid supply line BS 617 to enable supplying of a large amount of the flushing fluid.

In addition, the controller may supply the DIW as the flushing fluid to the first adjusting tank 440 and the first adjusting circulation line 431, circulate the flushing fluid, and control the flushing control valves 633a and 635a to discharge the flushing fluid through the drain lines HD2 and HD3.

By performing comprehensive flushing of the first adjusting tank 440 and the first adjusting circulation line 431 with the DIW as the flushing fluid, solid precipitates such as silica and impurities may be primarily removed.

Next, the controller performs flushing of solid precipitation regions where solid precipitates such as silica may easily be generated. Since accumulation of solid precipitates and impurities may be concentrated near the drain lines for discharging the processing liquid or flushing fluid, intensive flushing may be performed on these solid precipitation regions.

Figure 10A:
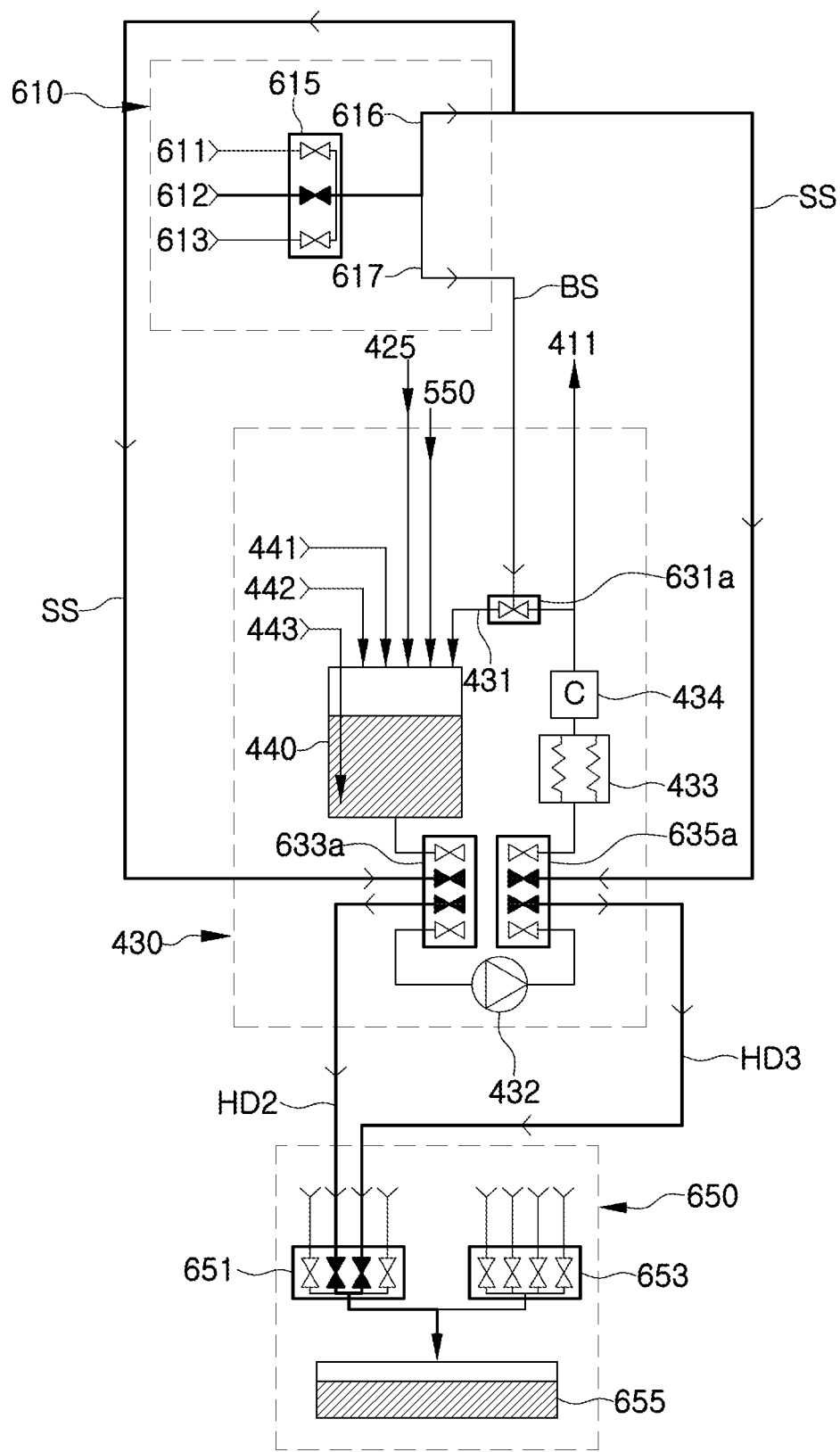

In this regard, as shown in FIG. 10A, the controller may control supplying of the flushing fluid containing HF from the HF supply unit 612 to the flushing control valves 633a and 635a disposed at the front and rear ends of the adjusting line pump 432, respectively, through the flushing fluid supply line SS 616. In some embodiments, an aqueous HF solution whose concentration of HF is adjusted considering the precipitates, impurities, or the like to be removed may be supplied as the flushing fluid.

In addition, the controller may perform intensive flushing near the drain lines by controlling the flushing fluid containing HF to be supplied and discharged through the drain lines HD2 and HD3 at the same time.

Figure 10B:
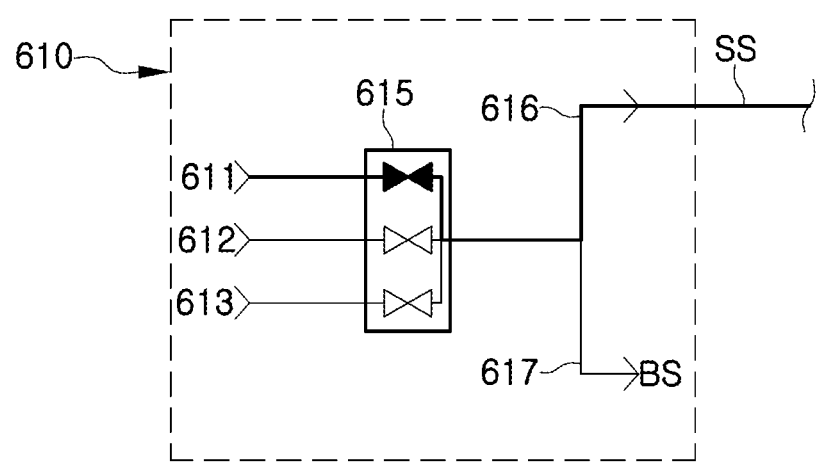

HF or the like remaining in the corresponding region after flushing with the flushing fluid containing HF affects supplying of a processing liquid thereafter. Therefore, as shown in FIG. 10B, the controller may control the DIW to be supplied from the DIW supply unit 611 through the flushing fluid supply line SS 616 as the flushing fluid. In addition, while supplying the DIW as the flushing fluid, the controller may control the DIW to be discharged through the drain lines HD2 and HD3.

Residual impurities, HF, or the like may be discharged using the DIW as the flushing fluid.

Next, as shown in FIG. 10C, the controller may control the inert gas to be supplied from the inert gas supply unit 613 through the flushing fluid supply line SS 616 as the flushing fluid and be discharged through the drain lines HD2 and HD3.

Residual impurities, DIW, or the like may be discharged by pressure of the inert gas, and at the same time, any residual DIW may be removed by evaporation.

Through such a flushing process, solid precipitates, impurities, or the like may be removed from the solid precipitation regions of the first adjusting supply unit 430. In addition, the flushing fluids may also be completely removed using the inert gas, thereby enabling supplying of a high-quality processing solution immediately after flushing.

FIGS. 11 and 12 show an embodiment in which flushing of a solid precipitation region of a main supply unit of a processing liquid supply apparatus is performed according to the present disclosure.

The adjusting supply unit 470 shown in FIGS. 11 and 12 is the main supply unit 470 disposed in the processing liquid supply unit 400 of FIG. 5. The main supply tank 480, the selected section of the processing liquid supply pipe 471, and the selected section of the sampling line 473 may be set as solid precipitation regions, and flushing may be performed on the regions.

Figure 11A:
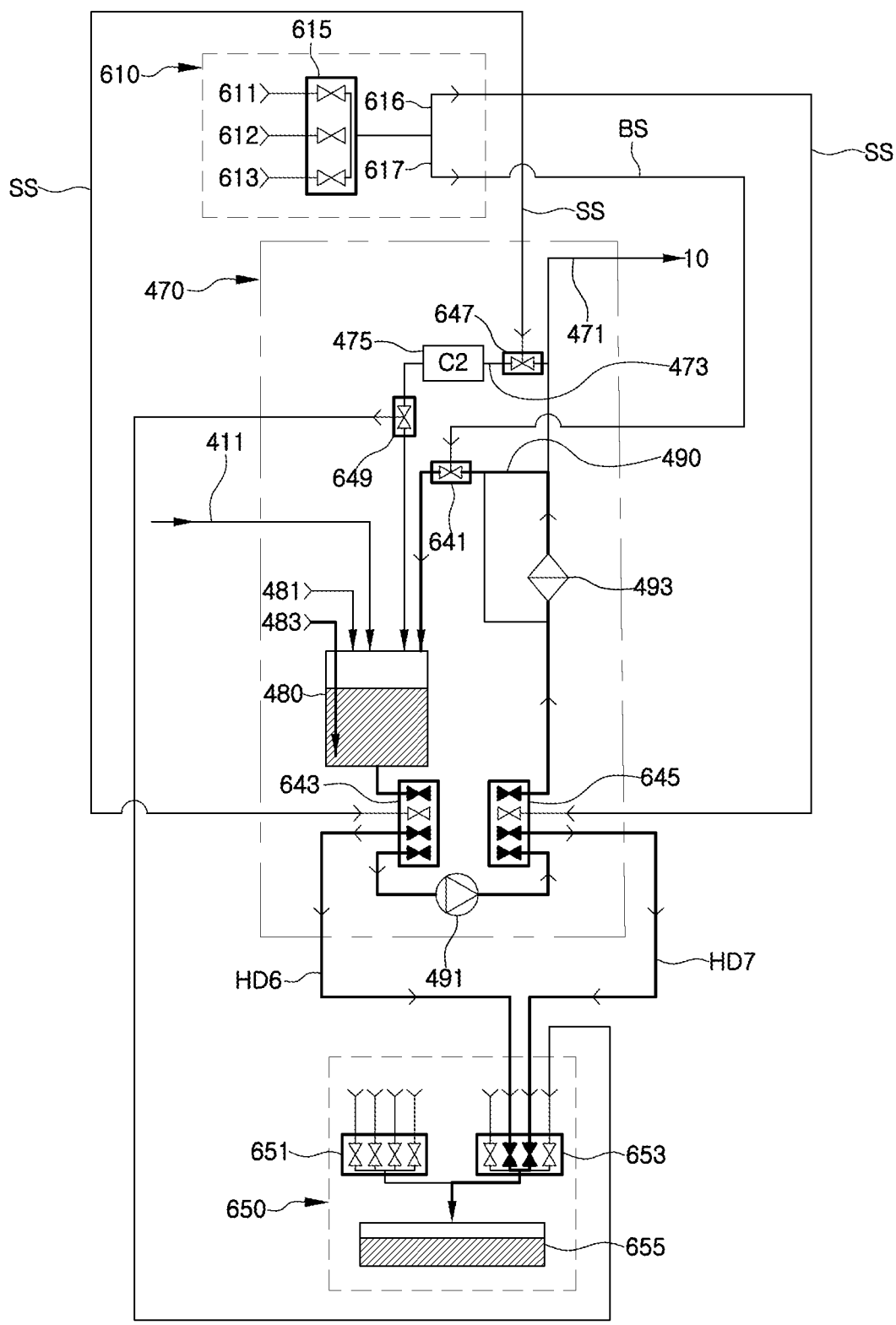
FIGS. 11A, 11B, and 12A to 12C show an embodiment in which flushing of a solid precipitation region of a main supply unit of a processing liquid supply apparatus is performed according to the present disclosure.
Figure 11B:
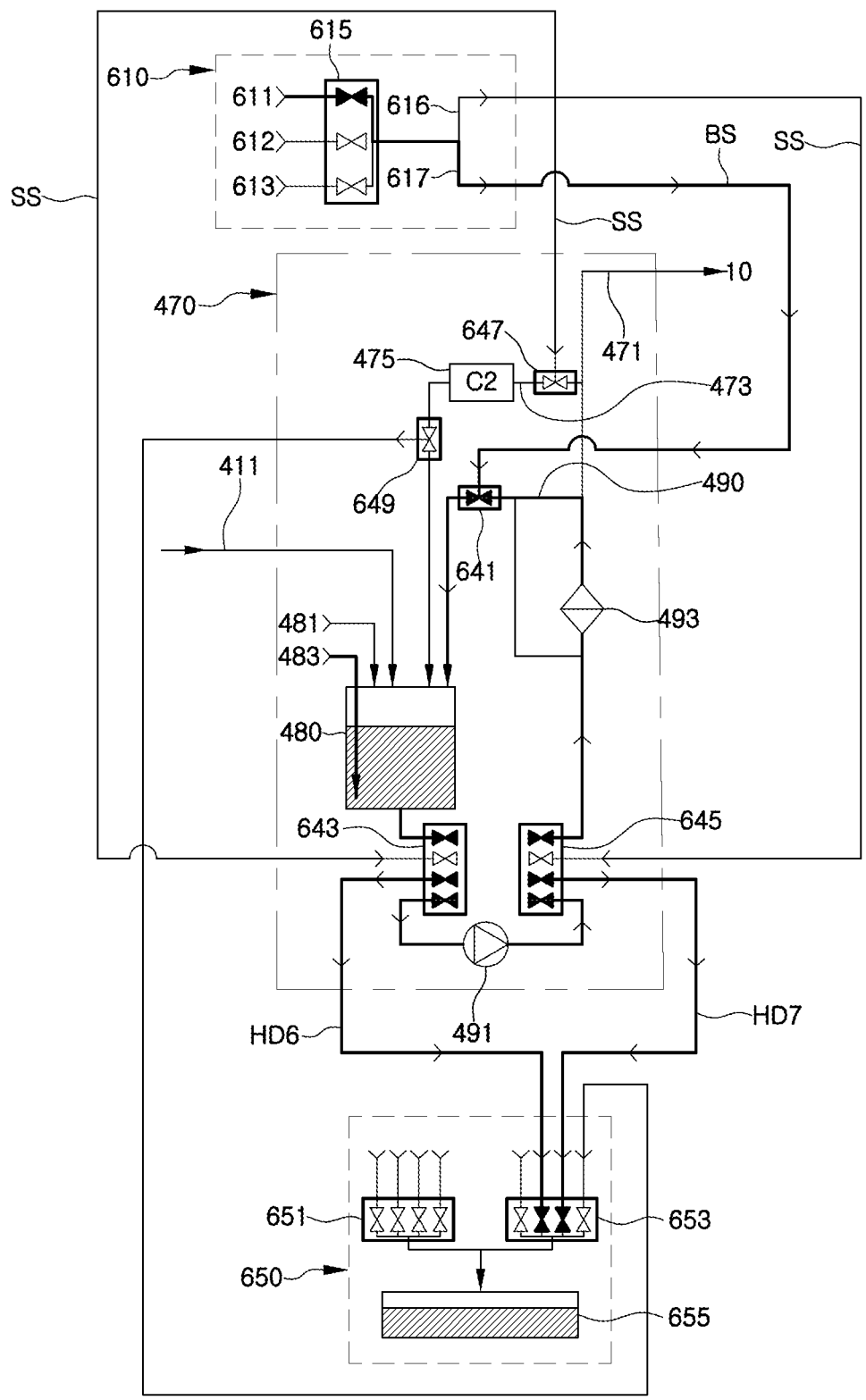

The controller stops the supply of processing liquid from the main supply unit 470 and discharges the processing liquid remaining in the main supply tank 480 and the processing liquid supply pipe 471 through the drain lines HD6 and HD7 as shown in FIG. 11A. At this time, a four-way valve may be used as the flushing control valves 643 and 645 of the flushing control system so that the valves may be controlled to circulate the processing liquid of the main supply tank 480 and the processing liquid supply pipe 471 and discharge the processing liquid through the drain lines HD6 and When the processing liquid remaining in the solid precipitation regions of the main supply unit 470 gets discharged, as shown in FIG. 11B, the controller may control the flushing control valve 641 disposed at the input end of the main supply tank 480 of the recovery line 490 to supply the DIW as the flushing fluid to the solid precipitation regions of the main supply unit 470. At this time, since a large amount of DIW needs to be supplied to the main supply tank 480 of the main supply unit 470 and the like, the DIW may be supplied through the flushing fluid supply line BS 617 to enable supplying of a large amount of the flushing fluid.

In addition, the controller may supply the DIW as the flushing fluid to the main supply tank 480 and the recovery line 490, circulate the flushing fluid, and control the flushing control valves 643 and 645 to discharge the flushing fluid through the drain lines HD6 and By performing comprehensive flushing of the main supply tank 480 and the recovery line 490 with the DIW as the flushing fluid, solid precipitates such as silica and impurities may be primarily removed.

Next, the controller may perform flushing of solid precipitation regions where solid precipitates such as silica may easily be generated. Since accumulation of solid precipitates and impurities may be concentrated near the drain lines for discharging the processing liquid or flushing fluid, intensive flushing may be performed on these solid precipitation regions.

Figure 12A:
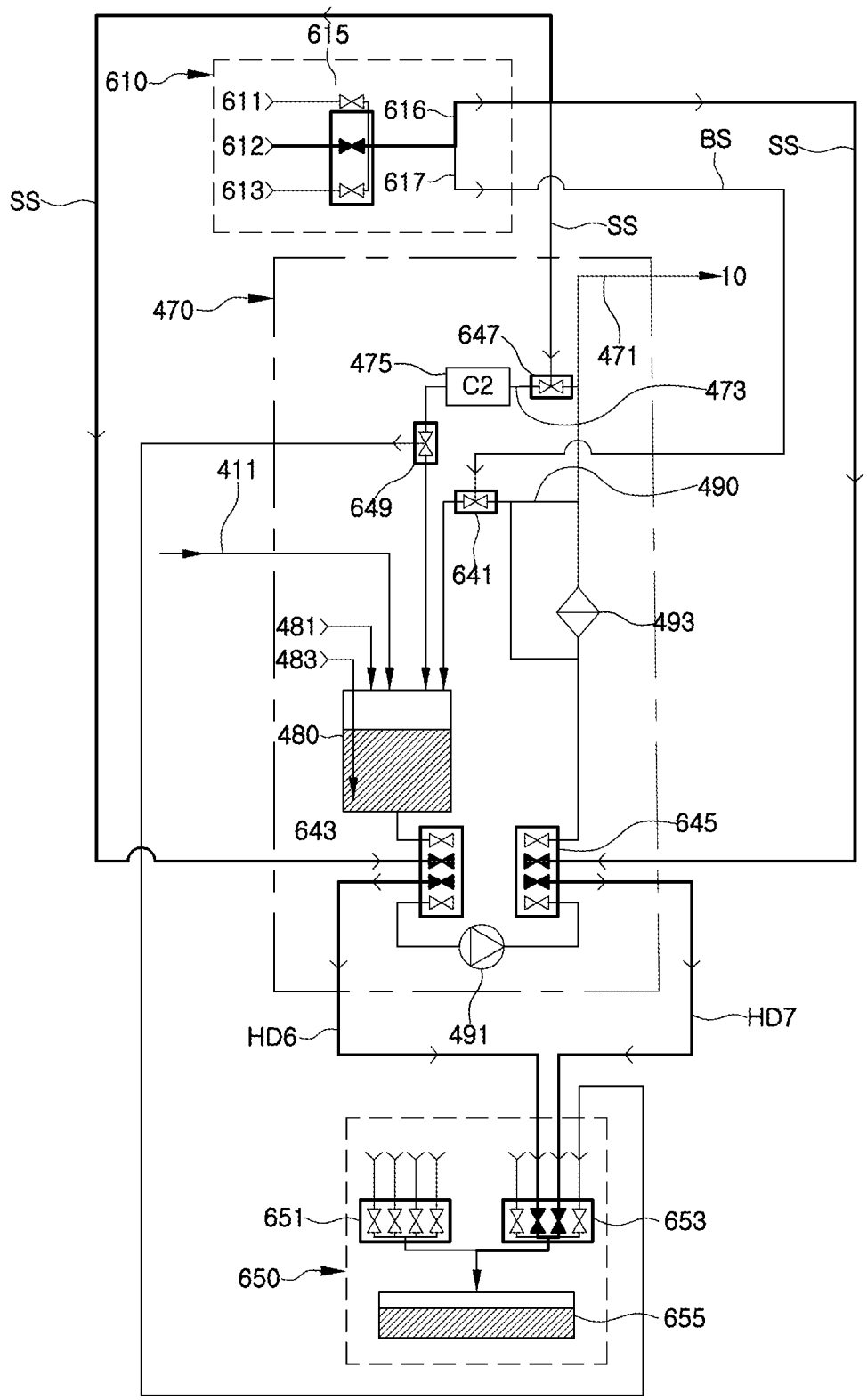

In this regard, as shown in FIG. 12A, the controller may control supplying of the flushing fluid containing HF from the HF supply unit 612 to the flushing control valves 643 and 645 disposed at the front and rear ends of the processing liquid supply pipe pump 491, respectively, through the flushing fluid supply line SS 616. In some embodiments, an aqueous HF solution whose concentration of HF is adjusted considering the precipitates, impurities, or the like to be removed may be supplied as the flushing fluid.

In addition, the controller may perform intensive flushing near the drain lines by controlling the flushing fluid containing HF to be supplied and discharged through the drain lines HD6 and HD7 at the same time.

Figure 12B:
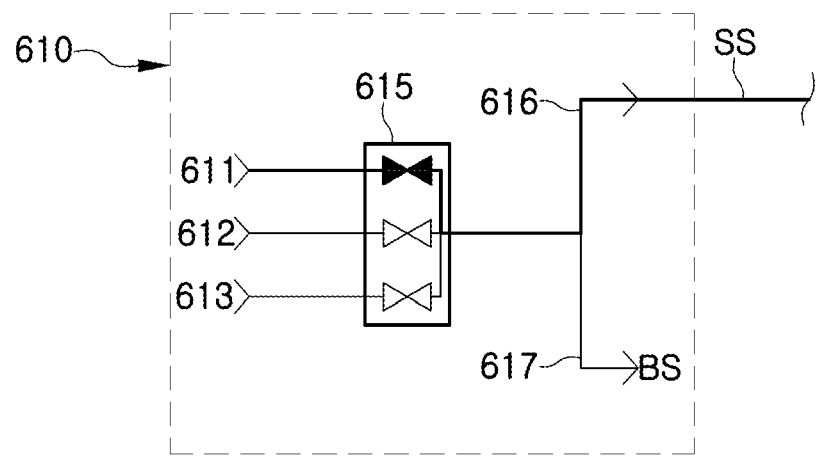

HF or the like remaining in the corresponding region after flushing with the flushing fluid containing HF affects supplying of a processing liquid thereafter. Therefore, as shown in FIG. 12B, the controller may control the DIW to be supplied from the DIW supply unit 611 through the flushing fluid supply line SS 616 as the flushing fluid. In addition, while supplying the DIW as the flushing fluid, the controller may control the DIW to be discharged through the drain lines HD6 and HD7.

Residual impurities, HF, or the like may be discharged using the DIW as the flushing fluid.

Figure 12C:
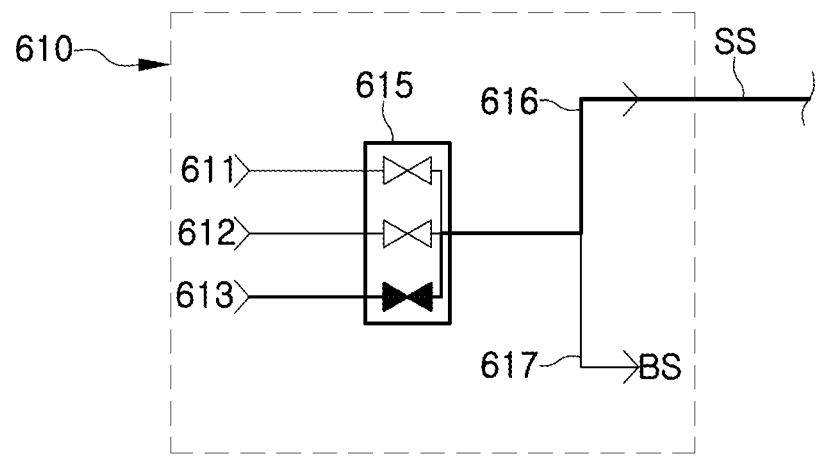

Next, as shown in FIG. 12C, the controller may control the inert gas to be supplied from the inert gas supply unit 613 through the flushing fluid supply line SS 616 as the flushing fluid and be discharged through the drain lines HD2 and HD3.

Residual impurities, DIW, or the like may be discharged by pressure of the inert gas, and at the same time, any residual DIW may be removed by evaporation.

Furthermore, through a process similar to that of FIGS. 11A and 11B, the supply of processing liquid to the sampling line 473 which measures a silica concentration by sampling the processing liquid supplied to the substrate processing apparatus may be stopped, and the drain line HD8 may be opened to discharge the residual processing liquid. Then, the flushing fluid supply line SS may be opened to flush the selected section including the silica densitometer 475 of the sampling line 473, and the flushing fluid used to perform flushing may be discharged by opening the drain line HD8.

Through such a flushing process, solid precipitates, impurities, or the like may be removed from the solid precipitation regions of the main supply unit 470. In addition, the flushing fluids may also be completely removed using the inert gas, thereby enabling supplying of a high-quality processing solution immediately after flushing.

FIGS. 13 and 14 show an embodiment in which flushing of a solid precipitation region of a processing liquid regeneration unit of a processing liquid supply apparatus is performed according to the present disclosure.

The processing liquid regeneration unit 560 is the first processing liquid regeneration unit 560 disposed in the processing liquid recycling unit 500 of FIG. 6. The first regeneration tank 570 and the selected section of the first regeneration circulation line 561 may be set as solid precipitation regions, and flushing may be performed on the regions.

Figure 13A:
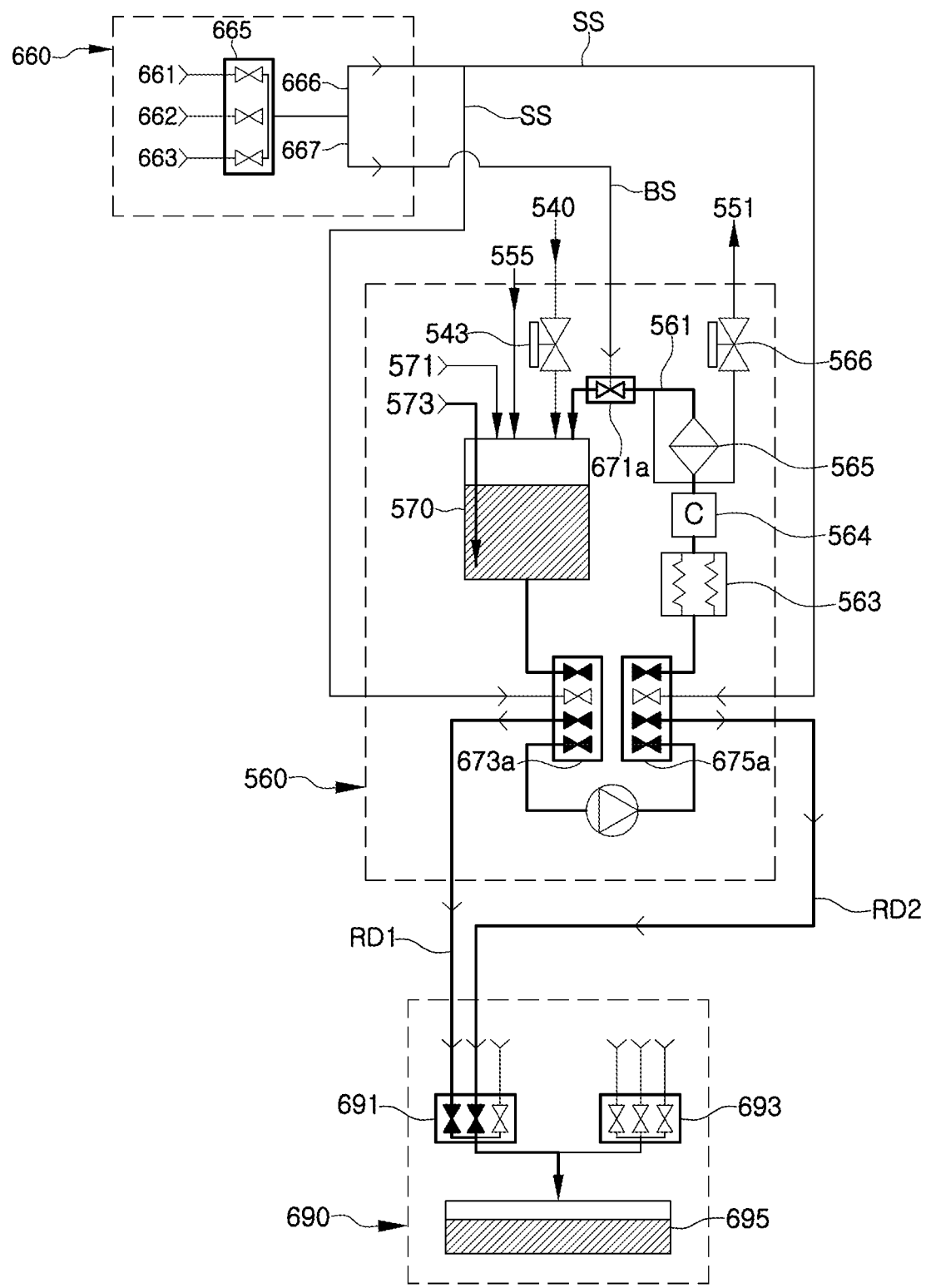
FIGS. 13A, 13B, and 14A to 14C show an embodiment in which flushing of a solid precipitation region of a processing liquid regeneration unit of a processing liquid supply apparatus is performed according to the present disclosure.

The controller stops the supply of processing liquid from the processing liquid regeneration unit 560 and discharges the processing liquid remaining in the first adjusting tank 570 and the first adjusting circulation line 561 through the drain lines RD1 and RD2 as shown in FIG. 13A. At this time, a four-way valve may be used as the flushing control valves 673a and 675a of the flushing control system so that the valves may be controlled to circulate the processing liquid of the first regeneration tank 570 and the first regeneration circulation line 561 and discharge the processing liquid through the drain lines RD1 and RD2.

The drain lines RD1 and RD2 may be combined through the manifold box 691 of the flushing discharge system 690. The discharged processing liquid may be stored in the buffer tank 695, subjected to predetermined processing, and discharged to the outside.

Figure 13B:
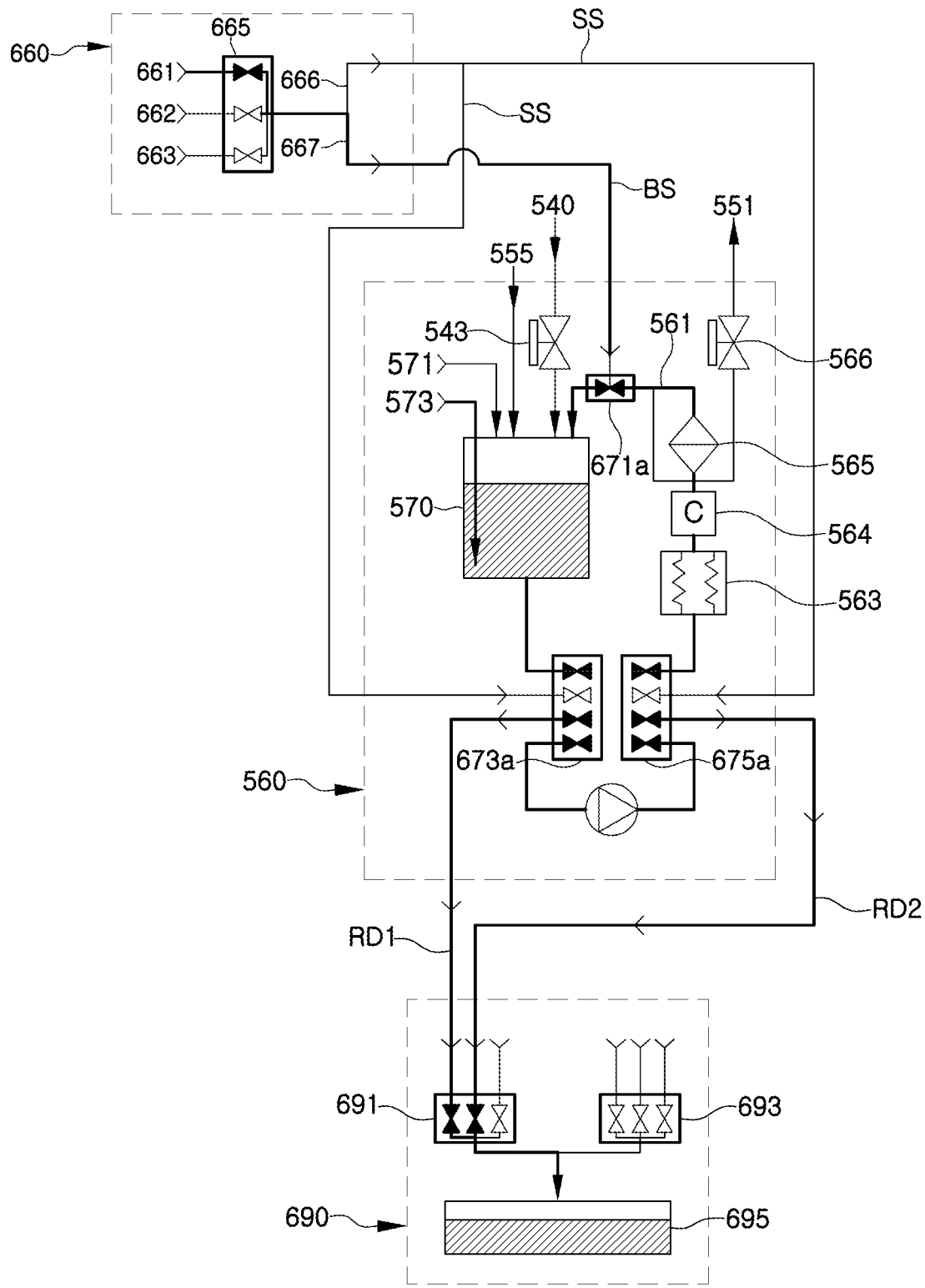

When the processing liquid remaining in the solid precipitation regions of the first processing liquid regeneration unit 560 gets discharged, as shown in FIG. 13B, the controller may control the flushing control valve 671a disposed at the input end of the first regeneration tank 570 of the first regeneration circulation line 561 to supply the DIW as the flushing fluid to the solid precipitation regions of the first processing liquid regeneration unit 560. At this time, since a large amount of DIW needs to be supplied to the first regeneration tank 570 of the first processing liquid regeneration unit 560 and the like, the DIW may be supplied through the flushing fluid supply line BS 667 to enable supplying of a large amount of the flushing fluid.

In addition, the controller may supply the DIW as the flushing fluid to the first regeneration tank 570 and the first regeneration circulation line 561, circulate the flushing fluid, and control the flushing control valves 673a and 675a to discharge the flushing fluid through the drain lines RD1 and RD2.

By performing comprehensive flushing of the first regeneration tank 570 and the first regeneration circulation line 561 with the DIW as the flushing fluid, solid precipitates such as silica and impurities may be primarily removed.

Next, the controller may control flushing of solid precipitation regions where solid precipitates such as silica may easily be generated. Since accumulation of solid precipitates and impurities may be concentrated near the drain lines for discharging the processing liquid or flushing fluid, intensive flushing may be performed on these solid precipitation regions.

Figure 14A:
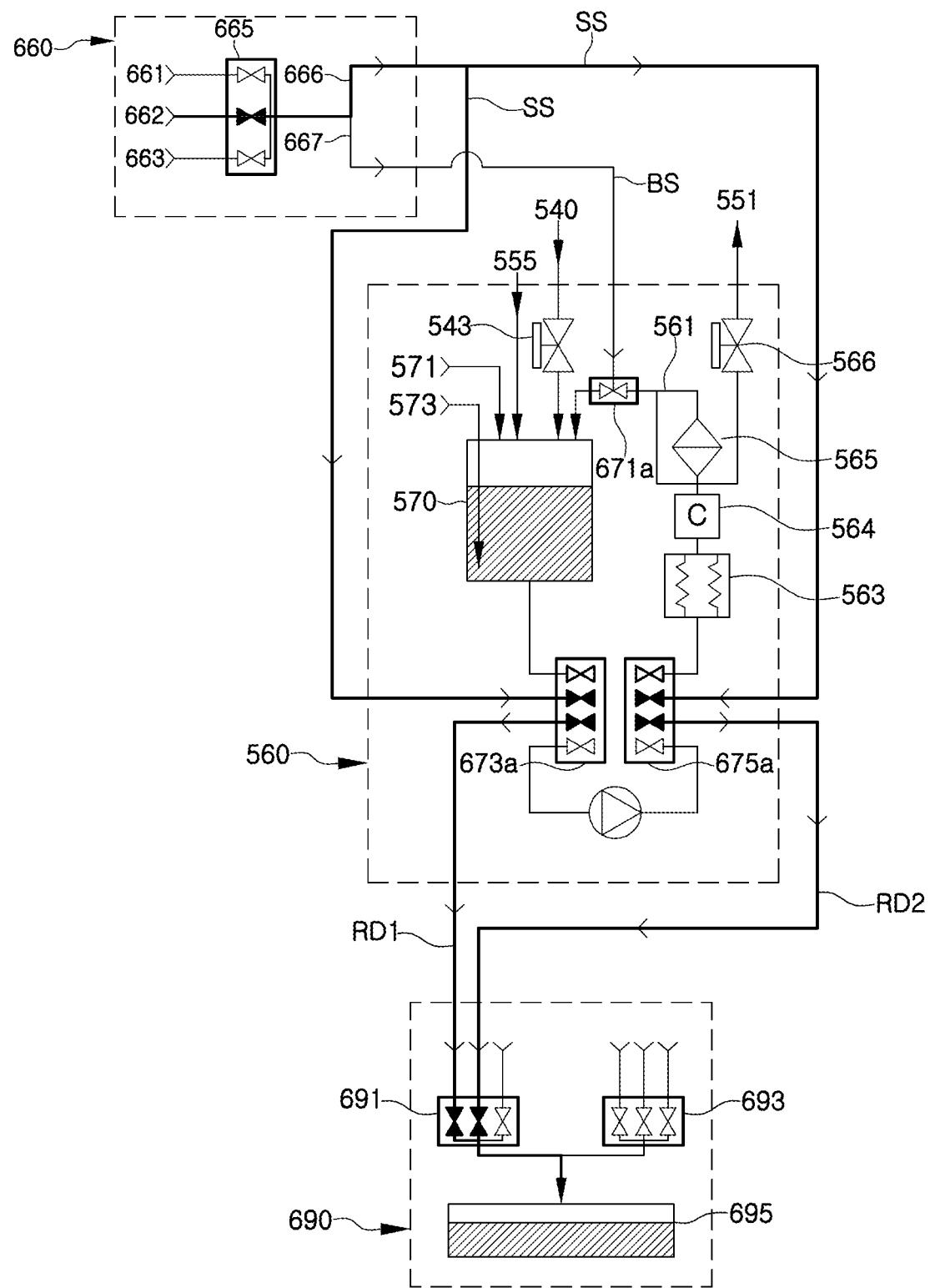

In this regard, as shown in FIG. 14A, the controller may control supplying of the flushing fluid containing HF from the HF supply unit 662 to the flushing control valves 673a and 675a disposed at the front and rear ends of the regeneration line pump 592, respectively, through the flushing fluid supply line SS 666. In some embodiments, an aqueous HF solution whose concentration of HF is adjusted considering the precipitates, impurities, or the like to be removed may be supplied as the flushing fluid.

In addition, the controller may perform intensive flushing near the drain lines by controlling the flushing fluid containing HF to be supplied and at the same time, be discharged through the drain lines RD1 and RD2.

Figure 14B:
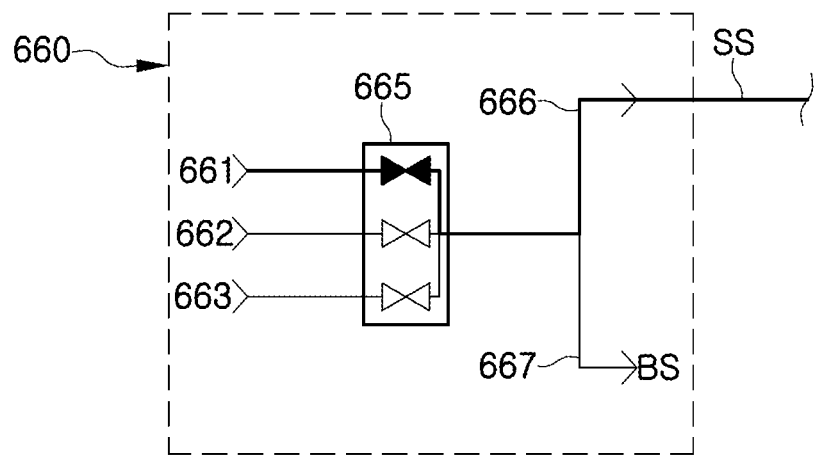

HF or the like remaining in the corresponding region after flushing with the flushing fluid containing HF affects supplying of a processing liquid thereafter. Therefore, as shown in FIG. 14B, the controller may control the DIW to be supplied from the DIW supply unit 661 through the flushing fluid supply line SS 666 as the flushing fluid. In addition, while supplying the DIW as the flushing fluid, the controller may control the DIW to be discharged through the drain lines RD1 and RD2.

Residual impurities, HF, or the like may be discharged using the DIW as the flushing fluid.

Figure 14C:
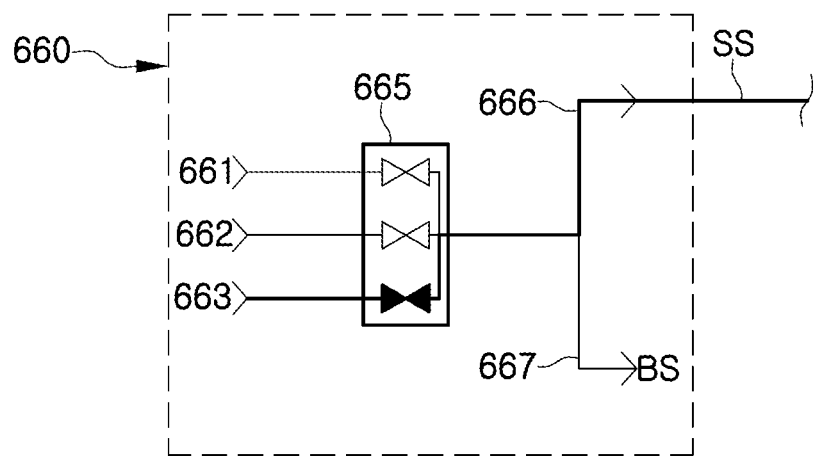

Next, as shown in FIG. 14C, the controller may control the inert gas to be supplied from the inert gas supply unit 663 through the flushing fluid supply line SS 666 as the flushing fluid and be discharged through the drain lines RD1 and RD2.

Residual impurities, DIW, or the like may be discharged by pressure of the inert gas, and at the same time, any residual DIW may be removed by evaporation.

Through such a flushing process, solid precipitates, impurities, or the like may be removed from the solid precipitation regions of the first processing liquid regeneration unit 560. In addition, the flushing fluids may also be completely removed using the inert gas, thereby enabling supplying of a high-quality processing solution immediately after flushing.

Figure 15A:
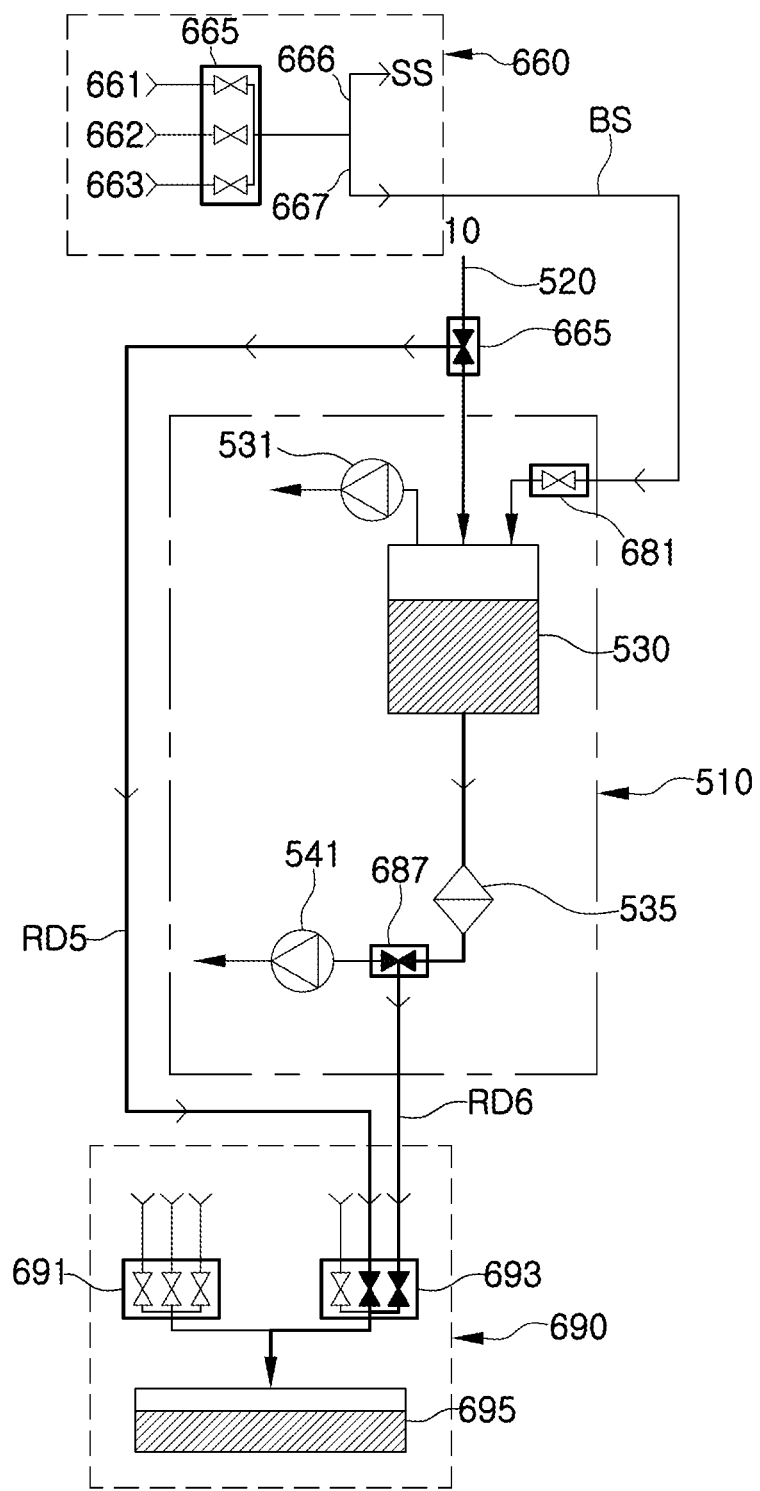
FIGS. 15A to 15C show an embodiment in which flushing of a solid precipitation region of a recovery unit of a processing liquid supply apparatus is performed according to the present disclosure.
Figure 15B:
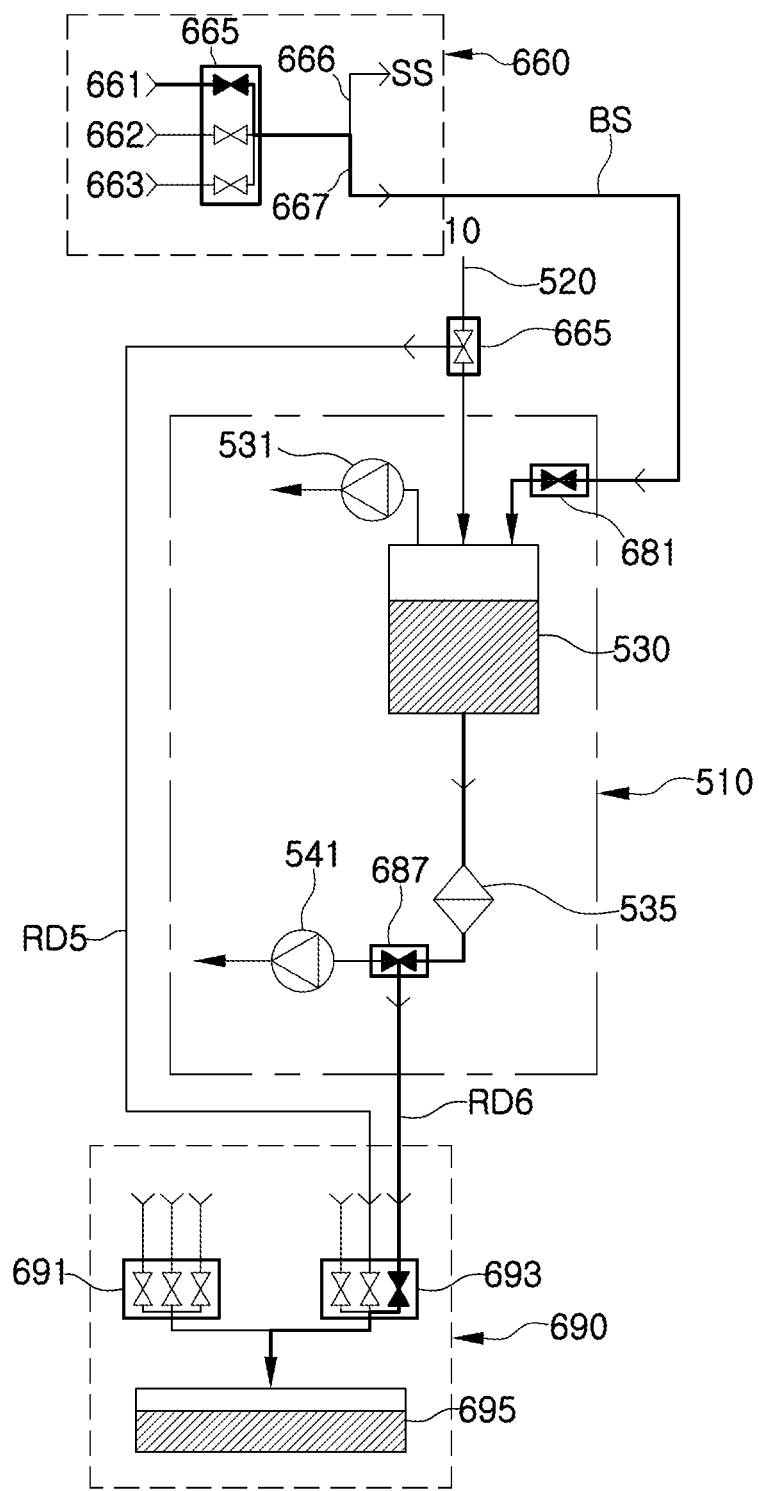
Figure 15C:
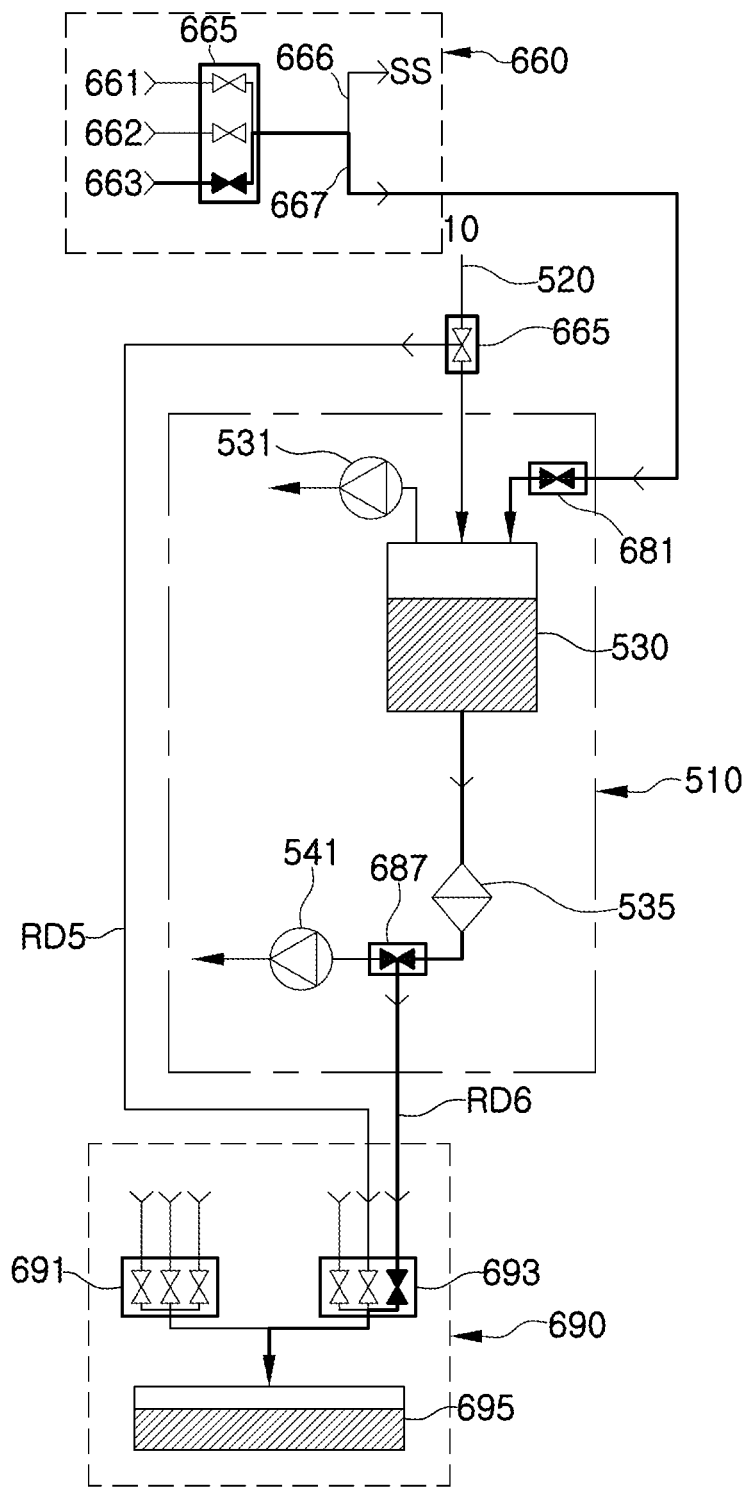

FIGS. 15A to 15C shows an embodiment in which flushing of a solid precipitation region of a recovery unit of a processing liquid supply apparatus is performed according to the present disclosure.

The recovery unit 510 of FIGS. 15A to 15C is the recovery unit 510 disposed in the processing liquid recycling unit 500 of FIG. 6. A selected section such as the recovery tank 530 of the recovery unit 510 may be set a solid precipitation region, and flushing may be performed on the region.

The controller stops the recovery and supply of processing liquid by the recovery unit 510, controls the flushing control valve 665 to discharge the processing liquid supplied from the substrate processing apparatus 10 directly through the drain line RD5, and controls the flushing control valve 687 to discharge the processing liquid remaining in the recovery tank 530 through the drain line RD6.

When the processing liquid remaining in the solid precipitation regions of the recovery unit 510 gets discharged, as shown in FIG. 12B, the controller may control the flushing control valve 681 disposed at the input end of the recovery tank 530 to supply the DIW as the flushing fluid to the recovery tank 530 of the recovery unit 510. At this time, since a large amount of DIW needs to be supplied to the recovery tank 530 and the like, DIW may be supplied through the flushing fluid supply line BS 667 to enable supplying of a large amount of flushing fluid.

In addition, while supplying the DIW as the flushing fluid to the recovery tank 530, the controller may control the flushing control valve 687 to discharge the DIW through the drain line RD6.

By flushing the recovery tank 530 and the like with the DIW as the flushing fluid, solid precipitates such as silica, impurities, and the like remaining in the recovery tank 530 and the like may be removed.

Next, as shown in FIG. 15C, the controller may control the inert gas to be supplied from the inert gas supply unit 663 through the flushing fluid supply line BS 667 as the flushing fluid, go through the recovery tank 530 and the like, and be discharged through the drain line RD6.

Residual impurities, DIW, or the like may be discharged by pressure of the inert gas, and at the same time, any residual DIW may be removed by evaporation.

Through such a flushing process, solid precipitates, impurities, or the like may be removed from the solid precipitation regions of the recovery unit 510. In addition, the flushing fluids may also be completely removed using the inert gas, thereby enabling supplying of a high-quality processing solution immediately after flushing.

According to the present disclosure as described above, solid precipitates such as silica may be effectively removed from the processing liquid supply apparatus through the flushing process, which may be immediately followed by supplying of the processing liquid. As a result, the present disclosure enables effective maintenance of process yield.

In particular, the present disclosure enables removal of precipitated solids, such as silica, by intensively flushing a solid precipitation region of the processing liquid supply apparatus from which silica may easily be precipitated.

Although the above description of the present disclosure has been provided for illustrative purposes, those skilled in the art will appreciate that various modifications, additions, and substitutions are possible, without departing from essential characteristics of the disclosure. Therefore, embodiments of the present disclosure are not intended to limit the technical spirit of the disclosure but rather to describe the technical spirit of the disclosure, and the scope of the disclosure is not to be limited by the above embodiments. The scope of the present disclosure is defined only by the accompanying claims and the equivalents thereof

What is claimed is:

1. A processing liquid supply apparatus supplying a processing liquid to a substrate processing apparatus, the processing liquid supply apparatus comprising:
   a flushing supply system configured to selectively supply a flushing fluid to a predetermined solid precipitation region of the processing liquid supply apparatus;
   a flushing control system configured to regulate a flow of the flushing fluid to flush the solid precipitation region;
   a flushing discharge system including a drain line connected to the flushing control system and configured to discharge the processing liquid or the flushing fluid from the solid precipitation region; and
   a controller configured to control the flushing supply system, the flushing control system, and the flushing discharge system such that flushing of the solid precipitation region is controlled.

2. The processing liquid supply apparatus of claim 1,
   wherein the flushing supply system comprises:
   a flushing fluid supply unit configured to supply the flushing fluid, wherein the flushing fluid contains at least one substance selected from the group consisting of hydrogen fluoride (HF), deionized water (DIW), and an inert gas;
   a flushing fluid supply line for transporting the flushing fluid to the solid precipitation region; and
   a flushing fluid supply valve for selectively supplying the flushing fluid from the flushing fluid supply unit to the flushing fluid supply line.

3. The processing liquid supply apparatus of claim 2,
   wherein the solid precipitation region comprises a region where a silica supply system configured to measure and supply a predetermined amount of silica in accordance with substrate processing conditions is disposed,
   wherein the flushing control system comprises:
   a front-end flushing control valve connected to the flushing fluid supply line and to a front end of a silica-measuring tube of the silica supply system; and
   a rear-end flushing control valve connected to a rear end of the silica-measuring tube and to a silica supply line,
   wherein the flushing control system is configured to flush residual silica remaining in the silica supply system after supplying the silica with the flushing fluid, and
   wherein the drain line of the flushing discharge system is connected to the rear-end flushing control valve to discharge the residual silica or residual flushing fluid from the silica supply system.

4. The processing liquid supply apparatus of claim 2,
   wherein the solid precipitation region comprises a region where at least one unit is disposed, the at least one unit being selected from at least one adjusting supply unit configured to adjust the processing liquid in accordance with substrate processing conditions, at least one processing liquid regeneration unit configured to adjust recovered processing liquid in accordance with regeneration conditions, and a main supply unit configured to supply the processing liquid to the substrate processing apparatus,
   wherein the flushing control system comprises at least one flushing control valve connected to the flushing fluid supply line and to a circulation line of at least one of the adjusting supply unit, the processing liquid regeneration unit, and the main supply unit,
   wherein the flushing control system is configured to flush the residual processing liquid with the flushing fluid, and
   wherein the drain line of the flushing discharge system is connected to the at least one flushing control valve to discharge the residual processing liquid or the residual flushing fluid into at least one of the adjusting supply unit, the processing liquid regeneration unit, and the main supply unit.

5. The processing liquid supply apparatus of claim 2,
   wherein the solid precipitation region comprises a region where at least one unit is disposed, the at least one unit being selected from at least one adjusting supply unit configured to adjust the processing liquid in accordance with substrate processing conditions, at least one liquid regeneration unit configured to adjust recovered processing liquid in accordance with regeneration conditions, a main supply unit configured to supply the processing liquid to the substrate processing apparatus, and a recovery unit configured to recover the processing liquid from the substrate processing apparatus,
   wherein the flushing control system comprises:
   a front-end flushing control valve connected to a flushing supply line and to a front end of a tank of at least one of the adjusting supply unit, the liquid regeneration unit, and the main supply unit; and
   a rear-end flushing control valve connected to the flushing supply line and to a rear end of the tank of at least one of the adjusting supply unit, the processing liquid regeneration unit, and the main supply unit,
   wherein the flushing control system is configured to flush the residual processing liquid with the flushing fluid, and
   wherein the drain line of the flushing discharge system is connected to the rear-end flushing control valve to discharge the residual processing liquid or the residual flushing fluid into the tank.

6. The processing liquid supply apparatus of claim 2,
wherein the solid precipitation region comprises a region where a sampling line for sampling the processing liquid supplied to the substrate processing apparatus and measuring a silica concentration of the processing liquid is disposed,
wherein the flushing control system comprises:
a front-end flushing control valve connected to the flushing fluid supply line and to a front end of a silica densitometer on the sampling line; and
a rear-end flushing control valve connected to the flushing fluid supply line and to a rear end of the silica densitometer on the sampling line,
wherein the flushing control system is configured to flush the residual processing liquid with the flushing fluid, and
wherein the drain line of the flushing discharge system is connected to the rear-end flushing control valve to discharge the residual processing liquid or the residual flushing fluid into the sampling line.

7. The processing liquid supply apparatus of claim 1,
wherein the solid precipitation region is provided in plural,
wherein the flushing discharge system comprises a plurality of drain lines for discharging residual processing liquid or residual used flushing fluid from each of the plurality of solid precipitation regions, and
wherein the processing liquid supply apparatus further comprises:
one or more manifold boxes configured to:
collect the processing liquid or the flushing fluid discharged from at least one drain line selected from among the plurality of drain lines; and
discharge the collected processing liquid or the collected flushing fluid through one discharge line.

8. The processing liquid supply apparatus of claim 7,
wherein the flushing discharge system further comprises a buffer tank configured to receive and store waste liquid from the one or more manifold boxes.

9. The processing liquid supply apparatus of claim 1, comprising:
a main supply unit configured to supply the processing liquid to the substrate processing apparatus;
a processing liquid supply unit comprising an adjusting supply unit configured to:
adjust the processing liquid in accordance with substrate processing conditions, and
provide the processing liquid to the main supply unit;
a recovery unit configured to recover the processing liquid from the substrate processing apparatus; and
a processing liquid recycling unit comprising a processing liquid regeneration unit configured to receive the recovered processing liquid from the recovery unit, adjust the recovered processing liquid in accordance with regeneration conditions to generate a regenerated processing liquid, and provide the regenerated processing liquid to the adjusting supply unit,
wherein the flushing supply system, the flushing control system, and the flushing discharge system are disposed to correspond to each of the processing liquid supply unit and the processing liquid recycling unit.

10. A processing liquid supply apparatus configured to supply a processing liquid to a substrate processing apparatus, comprising:
a flushing fluid supply unit configured to supply a flushing fluid containing at least one substance selected from the group consisting of hydrogen fluoride, deionized water, and an inert gas;
a flushing fluid supply line configured to supply the flushing fluid to a solid precipitation region;
a flushing supply system comprising a flushing fluid supply valve for selectively supplying the flushing fluid from the flushing fluid supply unit to the flushing fluid supply line;
a flushing control system comprising a flushing control valve for controlling a flow of the flushing fluid to the solid precipitation region to flush a residual processing liquid with the flushing fluid;
a flushing discharge system comprising a plurality of drain lines for discharging the residual processing liquid or a residual flushing fluid used to perform flushing in each of the solid precipitation regions, one or more manifold boxes configured to collect the processing liquid or the flushing fluid discharged from at least one drain lines selected from among the plurality of drain lines and discharge the collected processing liquid or the collected flushing fluid through one discharge line, and a buffer tank configured to receive and store the processing liquid or the flushing fluid from the one or more manifold boxes; and
a controller configured to control the flushing of the solid precipitation region, the controller selectively controlling opening and closing of the flushing fluid supply line and opening and closing of the drain line to enable flushing of the solid precipitation region with HF, DIW, and an inert gas in order or with DIW and an inert gas in order.

\* \* \* \* \*